US012568775B2

(12) United States Patent　　　　(10) Patent No.:　US 12,568,775 B2
Cheng et al.　　　　　　　　　　　(45) Date of Patent:　　Mar. 3, 2026

(54) METHOD FOR FORMING A MEMORY DEVICE AT A BACKSIDE OF A WAFER SUBSTRATE, AND MEMORY CELL INCLUDING A MEMORY DEVICE AT A BACKSIDE OF A WAFER SUBSTRATE

(71) Applicant: TAIWAN SEMICONDUCTOR MANUFACTURING COMPANY, LTD., Hsinchu (TW)

(72) Inventors: Chung-Liang Cheng, Hsinchu (TW); Lin-Yu Huang, Hsinchu (TW); Wen-Ting Lan, Hsinchu (TW); Li-Zhen Yu, Hsinchu (TW); Huang-Lin Chao, Hsinchu (TW); Pinyen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 791 days.

(21) Appl. No.: 17/866,189

(22) Filed: Jul. 15, 2022

(65) Prior Publication Data

US 2024/0023463 A1　　Jan. 18, 2024

(51) Int. Cl.
　*H10N 70/00*　　　(2023.01)
　*H10B 63/00*　　　(2023.01)
　*H10N 70/20*　　　(2023.01)

(52) U.S. Cl.
CPC ........... *H10N 70/066* (2023.02); *H10B 63/30* (2023.02); *H10N 70/24* (2023.02); *H10N 70/826* (2023.02); *H10N 70/841* (2023.02)

(58) Field of Classification Search
CPC ................................ H10B 63/30; H01L 24/94
See application file for complete search history.

(56) References Cited

U.S. PATENT DOCUMENTS

| | | | | |
|---|---|---|---|---|
| 2006/0128108 A1* | 6/2006 | Kim | ................. | H01L 21/02178 |
| | | | | 257/E21.28 |
| 2017/0301611 A1* | 10/2017 | Cheng | .............. | H01L 21/76898 |
| 2018/0219012 A1* | 8/2018 | Lilak | ................. | H10B 12/0387 |

OTHER PUBLICATIONS

S. M. Sze et al., Physics of Semiconductor Devices, John Wiley & Sons, 2007, pp. 297-298 (Year: 2007).*

* cited by examiner

*Primary Examiner* — Shih Tsun A Chou

(74) *Attorney, Agent, or Firm* — Birch, Stewart, Kolasch & Birch, LLP

(57) ABSTRACT

A method is provided for forming a memory device on a backside portion of a wafer substrate. In one step, a circuit device is formed on a frontside portion of the wafer substrate. In one step, the wafer substrate is etched to form a substrate indentation that exposes a portion of a circuit device. In one step, a memory device is formed, at least in part, in the substrate indentation.

20 Claims, 33 Drawing Sheets

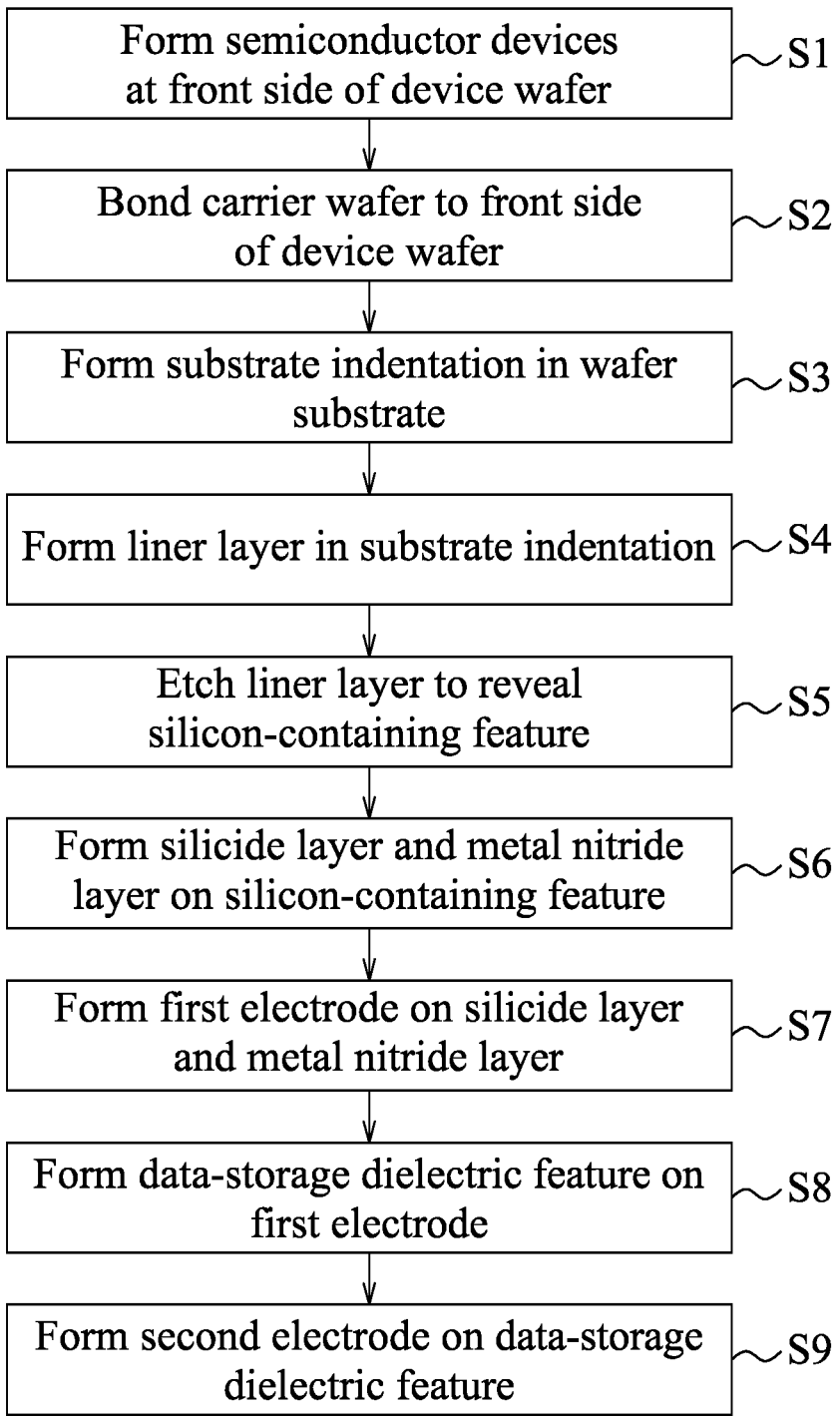

Form semiconductor devices
at front side of device wafer    ∼S1

Bond carrier wafer to front side
of device wafer    ∼S2

Form substrate indentation in wafer
substrate    ∼S3

Form liner layer in substrate indentation    ∼S4

Etch liner layer to reveal
silicon-containing feature    ∼S5

Form silicide layer and metal nitride
layer on silicon-containing feature    ∼S6

Form first electrode on silicide layer
and metal nitride layer    ∼S7

Form data-storage dielectric feature on
first electrode    ∼S8

Form second electrode on data-storage
dielectric feature    ∼S9

FIG. 1 wafer frontside wafer backside wafer backside wafer backside wafer backside wafer backside 132    134

100

142    144

110

138    140

116

1

20

200

2

FIG. 13 wafer backside wafer backside

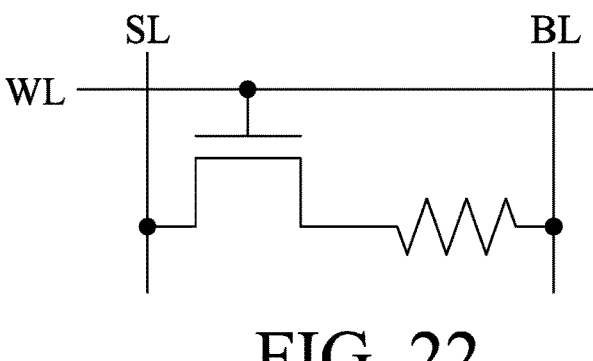
FIG. 22
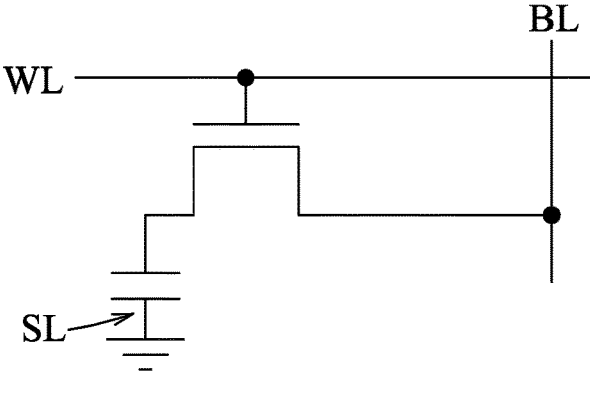
FIG. 23
FIG. 24 wafer backside wafer backside wafer backside wafer backside

METHOD FOR FORMING A MEMORY DEVICE AT A BACKSIDE OF A WAFER SUBSTRATE, AND MEMORY CELL INCLUDING A MEMORY DEVICE AT A BACKSIDE OF A WAFER SUBSTRATE

BACKGROUND

The semiconductor integrated circuit (IC) industry has over the past decades experienced tremendous advancements and is still experiencing vigorous development. With the dramatic advances in IC design, new generations of ICs have smaller and more complex structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating steps of a method for forming a memory device at a backside of a wafer substrate in accordance with some embodiments.

FIGS. 2 through 20 are schematic views illustrating the steps of the method in accordance with some embodiments.

FIGS. 22 through 24 are schematic circuit diagrams illustrating different types of memory cells in accordance with some embodiments.

DETAILED DESCRIPTION

Figure 2:
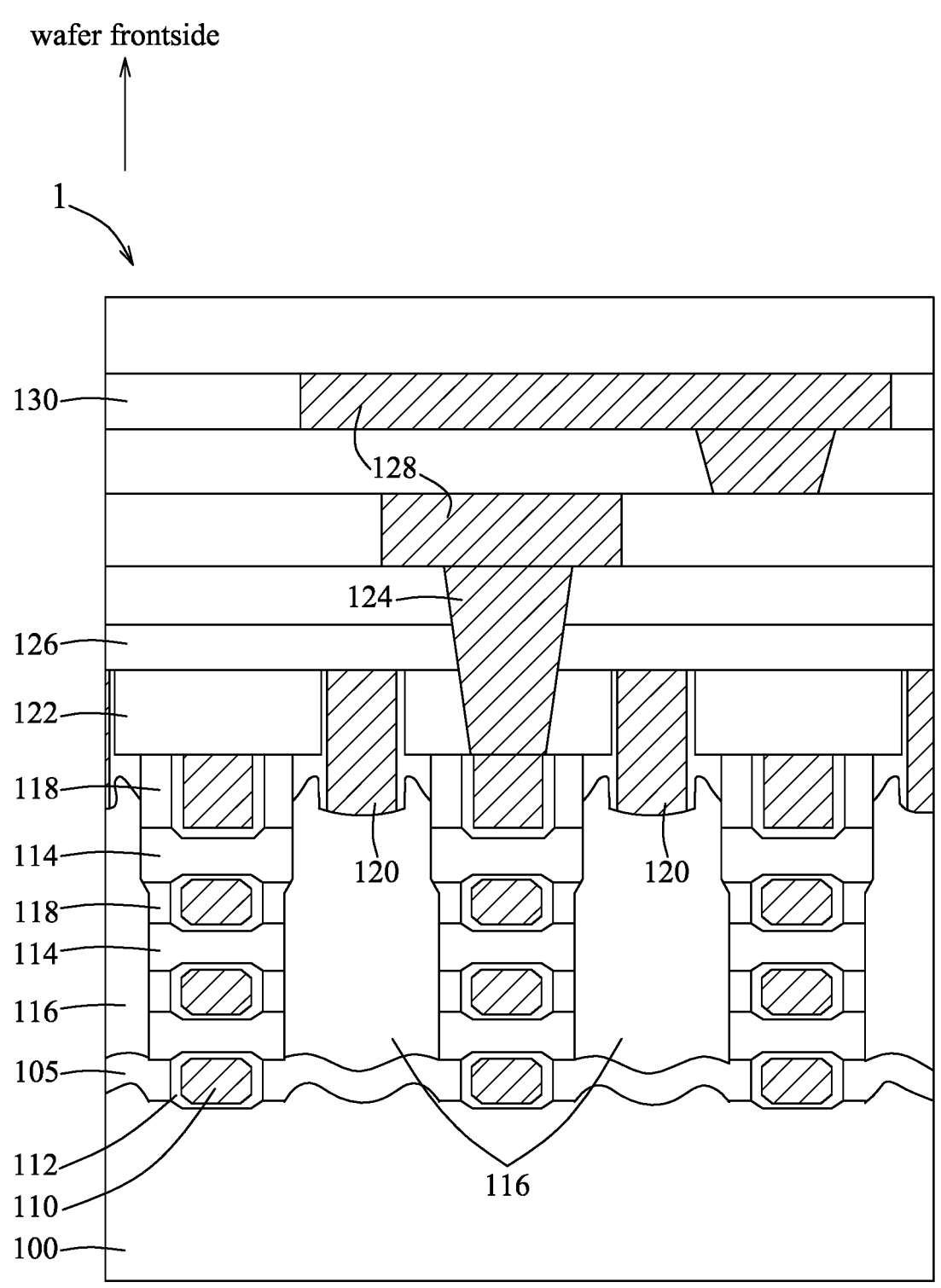

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the advancement of semiconductor manufacturing technology, dimensions of semiconductor devices become smaller and smaller. Since the shrinkage of the device dimensions and/or device pitches may increase density of wires, a frontside portion of a wafer may have insufficient space to form all the wires. In order to address such a problem, some passive components and wires may be formed on a backside portion of the wafer, so the frontside portion of the wafer can have sufficient space for routing of the remaining wires. A memory array is composed of a plurality of memory cells. Generally, a memory cell may include a semiconductor device (e.g., a transistor) for controlling read/write operation, and a memory device that stores data therein, such as resistive random-access memory (RRAM), dynamic random-access memory (DRAM), ferroelectric random-access memory (FeRAM), etc. When the memory array is to be formed on the wafer, one may choose to form the memory devices of the memory cells and the wires that are connected to the memory devices on the backside portion of the wafer, so the frontside portion of the wafer can have sufficient space for wire routing. In addition, some other wires, such power rails that may occupy larger spaces than other signal wires and/or other types of wires, can also be formed on the backside portion of the wafer.

FIG. 1 is a flow chart that cooperates with FIGS. 2 through 20 to illustrate steps of a method for forming a memory device in a backside portion of a wafer in accordance with some embodiments. Referring to FIGS. 1 and 2, in step S1, a device wafer 1 is exemplarily provided to include a plurality of circuit devices on a frontside portion of a wafer substrate 100. The wafer substrate 100 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The wafer substrate 100 may be made of a suitable semiconductor material, such as silicon or the like. In some embodiments, the wafer substrate 100 is a silicon substrate; and in other embodiments, the wafer substrate 100 is made of a compound semiconductor such as silicon carbide, gallium arsenide, indium arsenide, indium phosphide or other suitable materials. In still other embodiments, the wafer substrate 100 is made of an alloy semiconductor such as GaAsP, AlInAs, AlGaAs, GaInAs, GaInP, GaInAsP or other suitable materials.

In some embodiments, the wafer substrate 100 includes various p-type doped regions and/or n-type doped regions, such as p-type wells, n-type wells, p-type source/drain features and/or n-type source/drain features (source/drain feature(s) may refer to a source or a drain, individually or collectively, depending upon the context), formed by a suitable process such as ion implantation, thermal diffusion, a combination thereof, or the like. In some embodiments, the wafer substrate 100 may include other functional elements such as resistors, capacitors, diodes, transistors, and/or the like. The transistors are, for example, field effect transistors (FETs), such as planar FETs and/or 3D FETs (e.g., FinFETs, GAAFETs). The wafer substrate 100 may include lateral isolation features (e.g., shallow trench isolation (STI)) configured to separate various functional elements formed on and/or in the wafer substrate 100.

In the illustrative embodiment, the circuit devices are semiconductor devices, and more particularly, are exemplified as gate-all-around field-effect transistors (GAAFETs). Each of the semiconductor devices includes a gate electrode feature 110, multiple channel features 114 that are surrounded by the gate electrode feature 110, a gate dielectric 112 that is disposed between the gate electrode feature 110 and the channel features 114, a pair of source/drain features 116 that are disposed at opposite sides of the gate electrode feature 110 and that are connected to the channel features 114, and spacers 118 that are disposed between the gate electrode feature 110 and the source/drain features 116. In other embodiments, the semiconductor devices may include other types of circuit components, such as FinFETs, other suitable components, or any combination thereof, and this disclosure is not limited in this respect.

In accordance with some embodiments, the gate electrode feature 110 may include, for example, Cu, Ti, TiN, W, Al, Co, Ru, TiAlC, TaAlC, other suitable materials, or any combination thereof. In accordance with some embodiments, the channel features 114 may include, for example, Si, compound semiconductor, alloy semiconductor, other suitable materials, or any combination thereof. In accordance with some embodiments, the gate dielectric 112 may include, for example, a high-k material such as hafnium oxide, lanthanum oxide, etc., other suitable materials, or any combination thereof. In accordance with some embodiments, the source/drain features 116 are silicon-containing features that include silicon. In accordance with some embodiments, the source/drain features 116 are formed by, for example, epitaxial growth of silicon, other suitable techniques, or any combination thereof. In accordance with some embodiments, the spacers 118 may include, for example, silicon oxide, silicon nitride, oxygen-doped silicon nitride, carbon-doped silicon nitride, silicon carbide, other suitable low-k materials (e.g., having a dielectric constant smaller than 3.9), or any combination thereof. During the formation of the spacers 118, an isolation layer 105 may also be formed on the wafer substrate 100, so as to enhance electrical isolation between the wafer substrate 100 and the source/drain features 116. In the illustrative embodiment, a first dielectric layer 122 is formed over the semiconductor devices, and several metal contacts 120 are formed in the first dielectric layer 122 to electrically connect the source/drain features 116 to other circuit elements. A second dielectric layer 126 is formed over the first dielectric layer 122, a frontside interlayer dielectric (ILD) 130 is formed on the second dielectric layer 126, and multiple metal wire layers 128 are formed in the frontside interlayer dielectric 130 and over the semiconductor devices in a frontside direction (upwards in FIG. 2). In the illustrative embodiment, one of the metal wire layers 128 is electrically connected to the gate electrode feature 110 of one of the semiconductor devices through a gate contact via 124 that is formed in the frontside interlayer dielectric 130, the second dielectric layer 126 and the first dielectric layer 122. In accordance with some embodiments, the first dielectric layer 122 may include, for example, silicon oxide, silicon nitride, silicon carbide, silicon oxynitride, silicon oxycarbide, a low-k material, other suitable materials, or any combination thereof. In accordance with some embodiments, the metal contacts 120 may include, for example, Co, W, Ru, Cu, Al, Mo, Ti, Ni, Au, Pt, Pd, other suitable materials, or any combination thereof. In accordance with some embodiments, the second dielectric layer 126 may include, for example, silicon oxide, silicon nitride, silicon carbide, silicon oxynitride, silicon oxycarbide, a low-k material, other suitable materials, or any combination thereof. In the illustrative embodiment, the first dielectric layer 122 is made of silicon dioxide or a low-k material for reducing a resistive-capacitive (RC) delay of the entire circuit, and the second dielectric layer 126 is made of silicon nitride to enhance electric isolation and to serve as an etch stop layer, but this disclosure is not limited to such. In accordance with some embodiments, the frontside interlayer dielectric 130 may include, for example, silicon oxide, silicon nitride, silicon oxynitride, silicon carbonitride, silicon carbide oxynitride, spin-on glass (SOG), phosphosilicate glass (PSG), borophosphosilicate glass (BPSG), FSG, carbon doped silicon oxide (e.g., SiCOH), polyimide, other suitable materials, or any combination thereof. In accordance with some embodiments, the metal wire layers 128 and the gate contact via 124 may include, for example, Co, W, Ru, Cu, Al, Mo, Ti, Ni, Au, Pt, Pd, other suitable materials, or any combination thereof.

Figure 3:
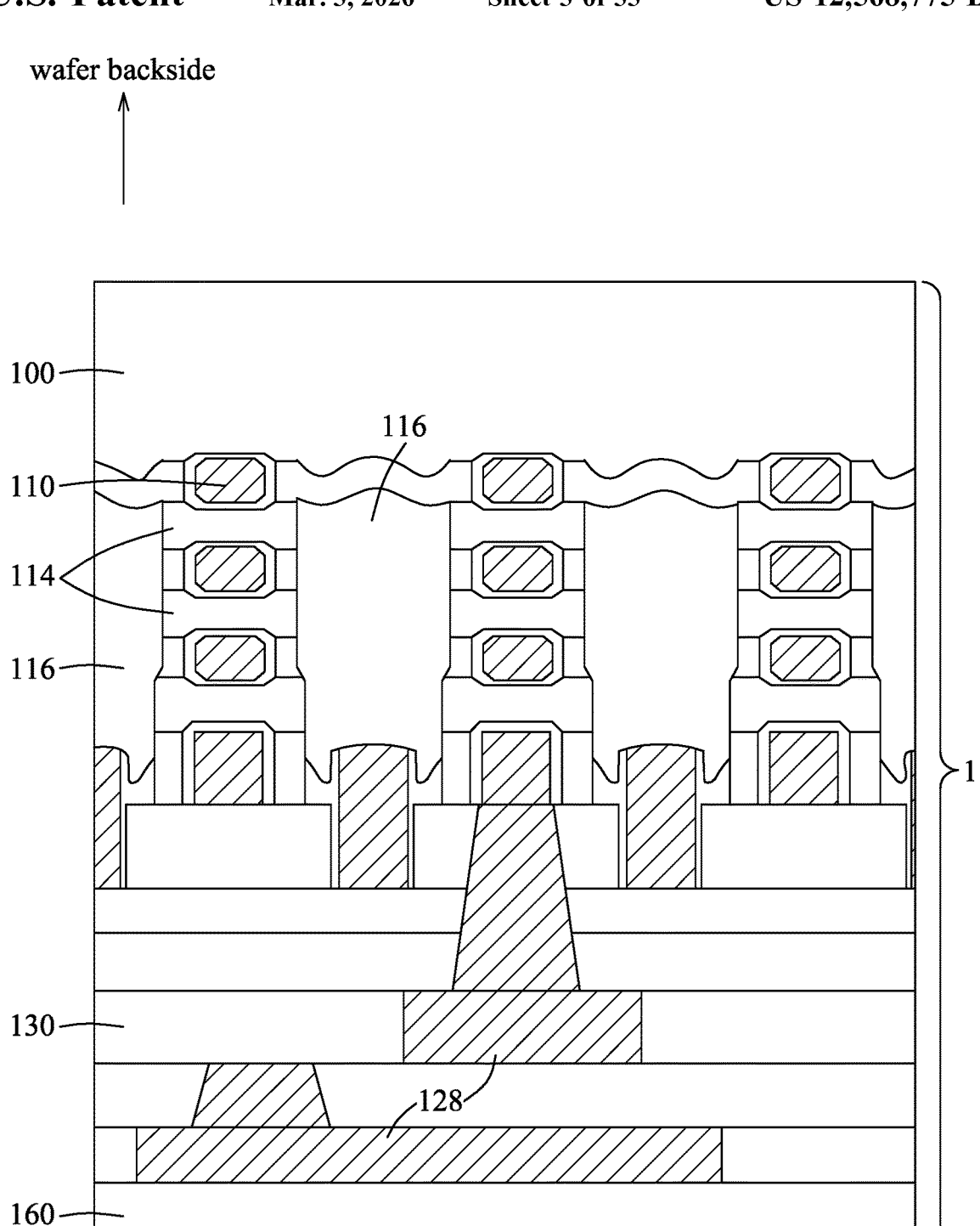

Referring to FIGS. 1 and 3, in step S2, a carrier wafer 2 is bonded to the frontside portion of the device wafer 1 where the semiconductor devices are formed. The carrier wafer 2 includes a substrate 200, and a bonding layer 20 formed on the substrate 200. The substrate 200 may be a semiconductor substrate that is made of, for example, silicon, a compound semiconductor such as silicon carbide, gallium arsenide, indium arsenide, indium phosphide, an alloy semiconductor such as GaAsP, AlInAs, AlGaAs, GaInAs, GaInP, GaInAsP, or other suitable materials. In the illustrative embodiment, the device wafer 1 and the carrier wafer 2 are connected together by oxide-oxide wafer bonding. The bonding layer 20 may be, for example, a silicon oxide (SiO$_x$) layer. The device wafer 1 is also provided with a bonding layer 160 (e.g., a silicon oxide layer) on top of the device wafer 1, when the frontside direction is considered the upward direction. In accordance with some embodiments, the bonding layer 20 of the carrier wafer 2 may have a thickness greater than 200 angstroms to achieve good bonding.

Figure 4:
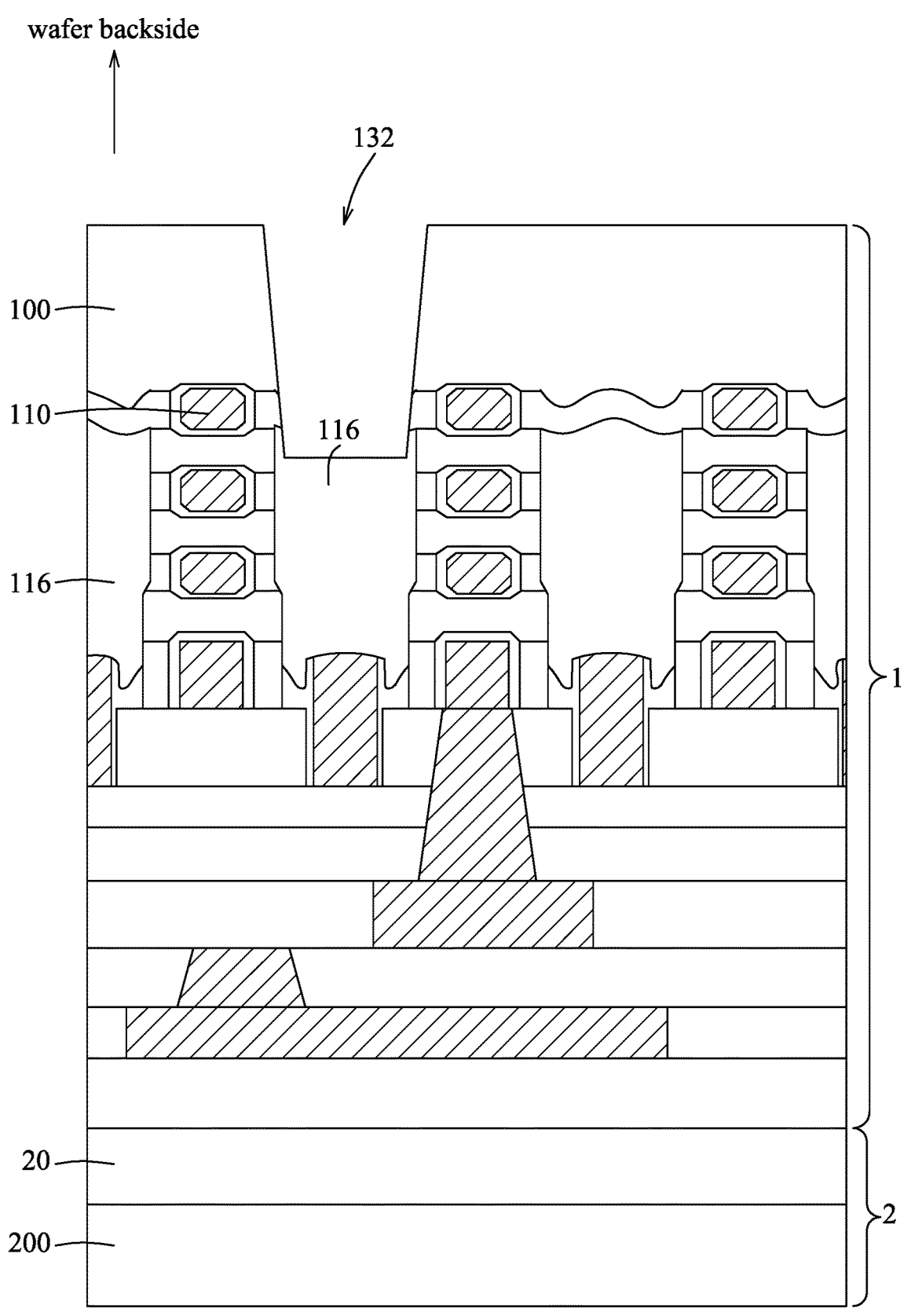

Referring to FIGS. 1 and 4, in step S3, a backside portion of the wafer substrate 100 is etched to form a substrate indentation 132, wherein the substrate indentation 132 is disposed above the semiconductor devices when viewed in a backside direction opposite to the frontside direction. The substrate indentation 132 exposes one of the source/drain features 116 (referred to as silicon-containing feature 116 hereinafter) that is disposed in the wafer substrate 100. In some embodiments, the wafer substrate 100 may be the original semiconductor substrate as described above. In some embodiments, before step S3, the original semiconductor substrate may be removed from the backside of the device wafer 1, and a dielectric material, such as SiO$_2$, may be deposited to form a new wafer substrate 100. In other words, in the subsequent backside process, the wafer substrate 100 may be made of, for example, Si, SiO$_2$, other suitable materials, or any combination thereof. In accordance with some embodiments, the wafer substrate 100 may be etched using, for example, wet etching, dry etching, other suitable techniques, or any combination thereof.

Figure 5:
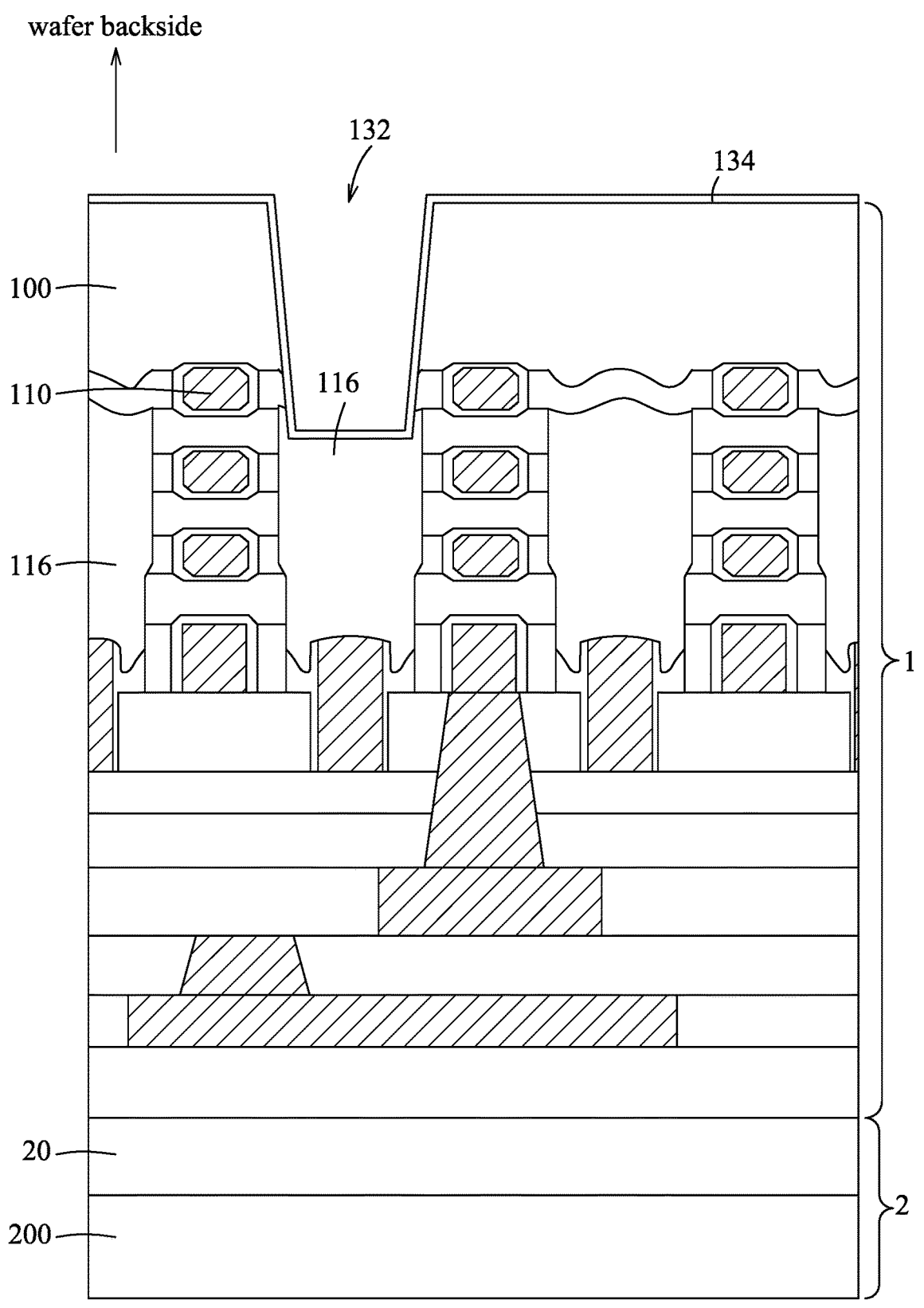

Referring to FIGS. 1 and 5, in step S4, a dielectric liner layer 134 is conformally formed over the backside portion of the wafer substrate 100 and in the substrate indentation 132 (i.e., over a sidewall and a bottom of the substrate indentation 132 when the backside direction is considered the upward direction). In accordance with some embodiments, the dielectric liner layer 134 may include, for example, SiN, SiCN, SiOCN, other low-k nitride, other suitable materials, or any combination thereof, and may be formed using, for example, atomic layer deposition (ALD), other suitable techniques, or any combination thereof. The dielectric liner layer 134 is used to prevent current leakage from the memory device, which will be subsequently formed in the substrate indentation 132, into the wafer substrate 100.

Figure 6:
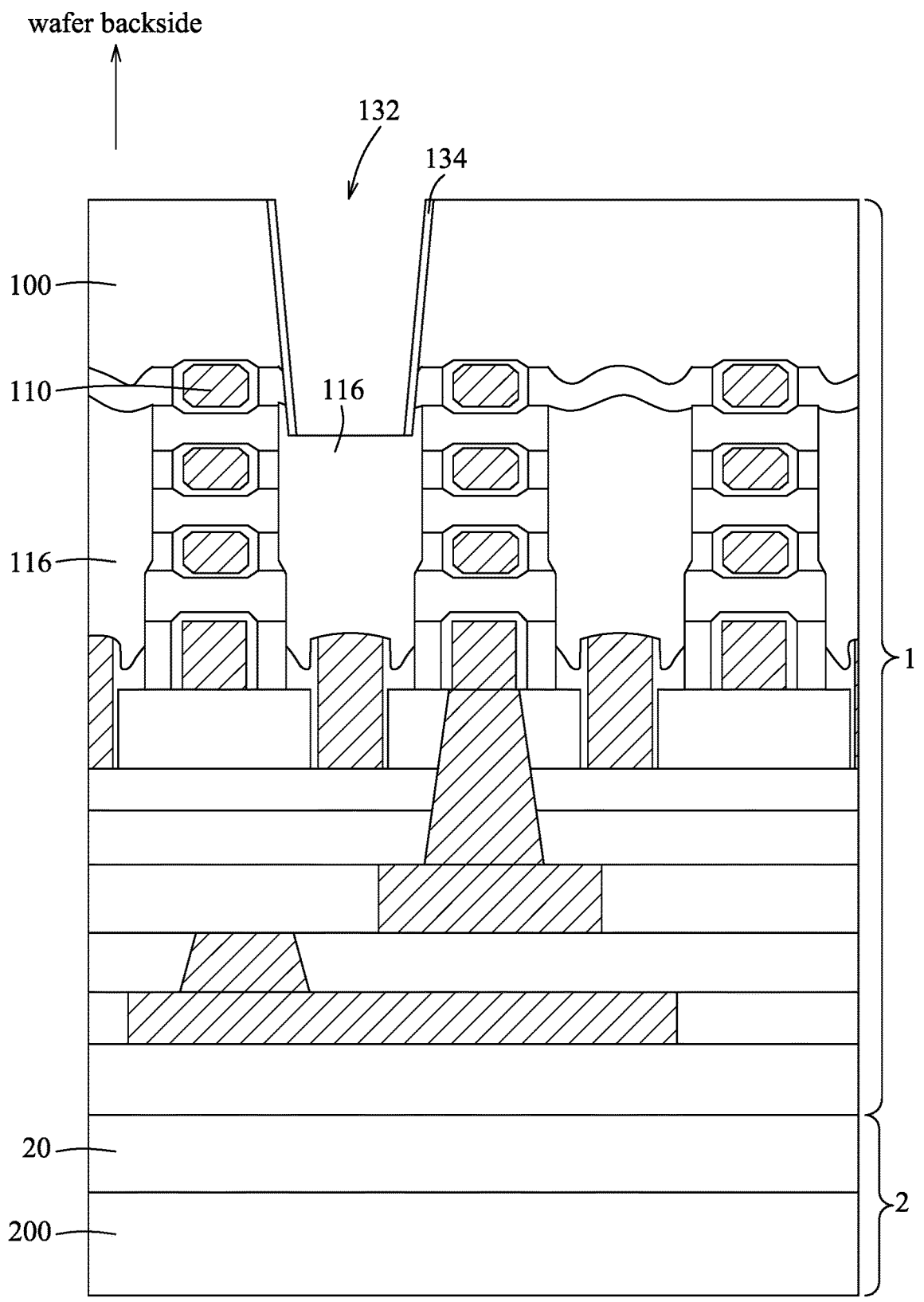

Referring to FIGS. 1 and 6, in step S5, when the backside direction is considered the upward direction, a portion of the dielectric liner layer 134 that is disposed at the bottom of the substrate indentation 132 and a portion of the dielectric liner layer 134 that is disposed over a top surface of the wafer substrate 100 and outside of the substrate indentation 132 are etched, so that the silicon-containing feature 116 is revealed at the bottom of the substrate indentation 132, while the remaining portion of the dielectric liner layer 134 is still attached to the sidewall of the substrate indentation 132. In accordance with some embodiments, the dielectric liner layer 134 may be etched using an anisotropic dry etching technique, such as reactive-ion etching (RIE), ion beam etching (IBE), other suitable techniques, or any combination thereof.

Figure 7:
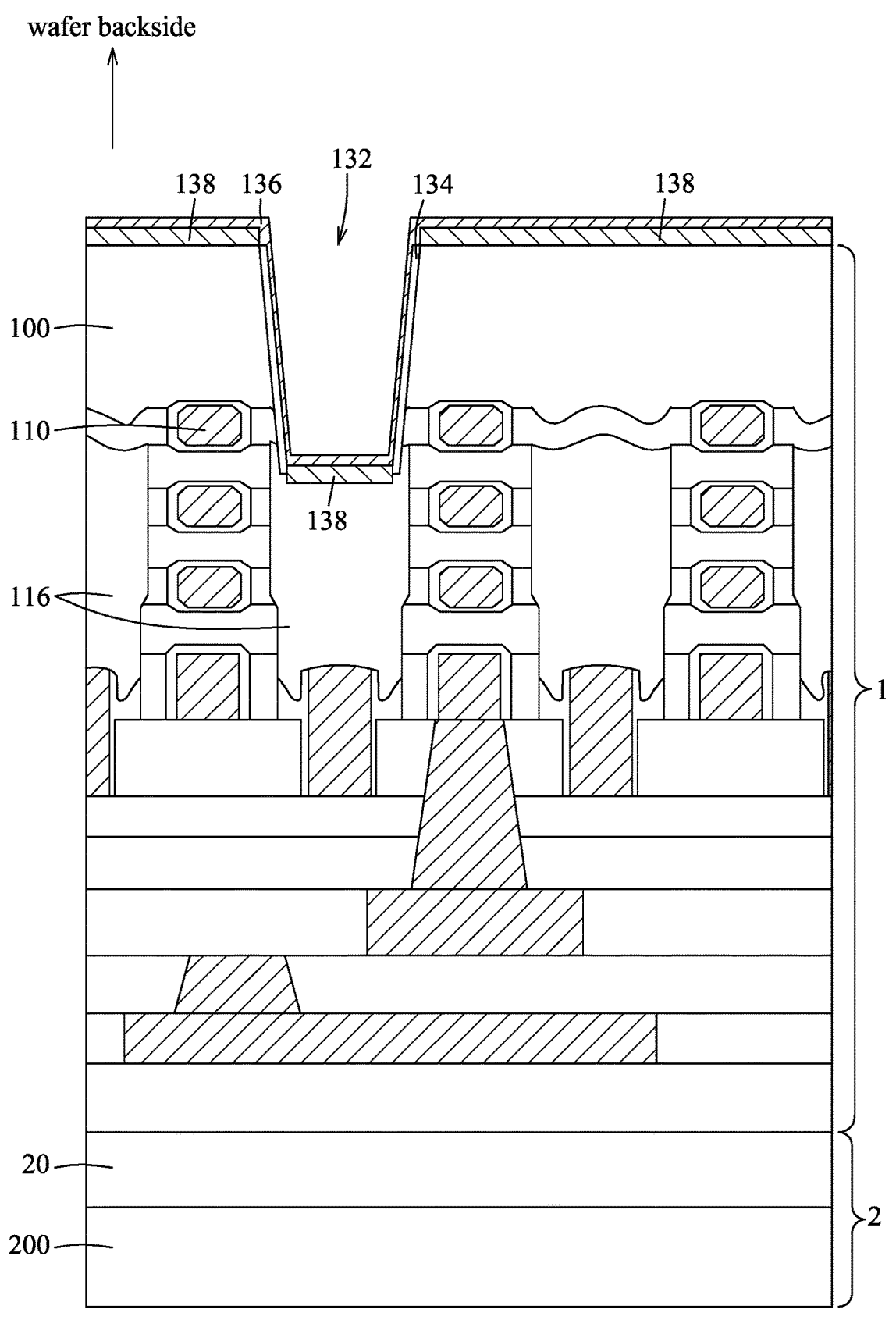
Figure 8:
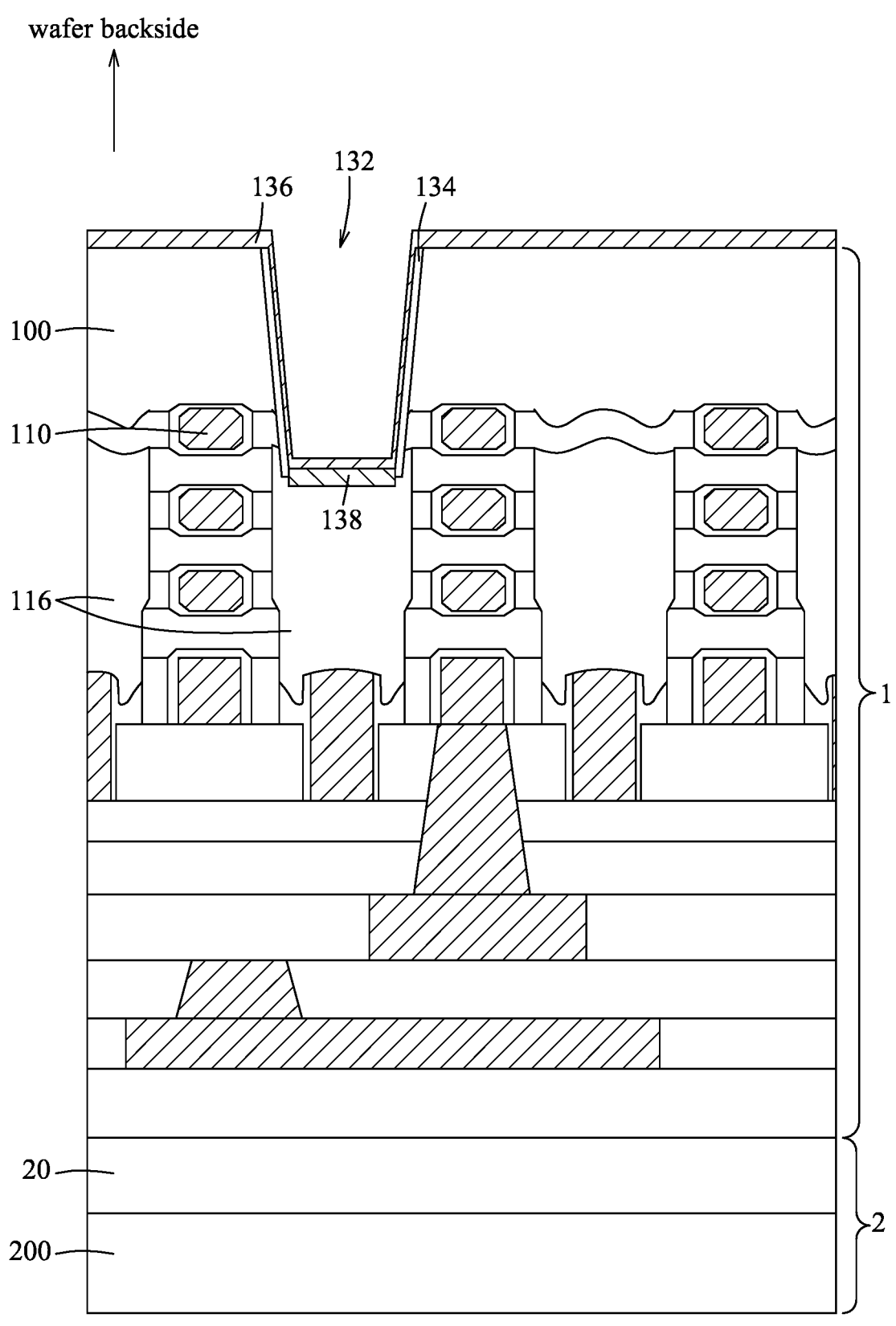

Referring to FIGS. 1 and 7 or FIGS. 1 and 8, in step S6, a silicide layer 138 is formed over the silicon-containing feature 116, so as to reduce contact resistance between the memory device and the silicon-containing feature 116, where FIG. 7 illustrates a case where the wafer substrate 100 is made of silicon, and FIG. 8 illustrates a case where the wafer substrate 100 is made of $SiO_2$. In detail, a preclean process is first performed to remove native oxide that is formed over the exposed silicon-containing feature 116. In accordance with some embodiments, the preclean process may be performed using $NF_3/NH_3$ plasma to transform the native oxide into $(NH_4)_2SiF_6$, and an annealing process to sublimate the $(NH_4)_2SiF_6$. After the preclean process, the silicide layer 138 is formed by conformally depositing a metal film 136 on the backside portion of the wafer substrate 100 and in the substrate indentation 132, and having the metal film 136 react with the silicon-containing feature 116 to form the silicide layer 138 at an interface between the silicon-containing feature 116 and the metal film 136. In accordance with some embodiments, the metal film 136 may include, Ti, Ni, Co, W, Pt, other suitable materials, or any combination thereof, so the silicide layer 138 may be, for example, Ti silicide, Ni silicide, Co silicide, W silicide, Pt silicide, other types of silicide, or any combination thereof. In accordance with some embodiments where the silicide layer 138 is made of Ti silicide, the silicide layer 138 may be formed using, for example, chemical vapor deposition (CVD) that employs $TiCl_4$ and hydrogen at a process temperature in a range from about 350° C. to about 500° C. In accordance with some other embodiments where the silicide layer 138 is made of Ti silicide, the silicide layer 138 may be formed using, for example, physical vapor deposition (PVD) to conformally form a Ti layer on the backside portion of the substrate 100 and in the substrate indentation 132, followed by an annealing process that may have a process temperature in a range from about 500° C. to about 600° C. to induce silicidation at the interface between the silicon-containing feature 116 and the Ti layer. However, this disclosure is not limited to specific methods or specific materials for forming the silicide layer 138. Since the metal film 136 tends to be formed on silicon rather than on dielectric material, the metal film 136 is barely formed on the sidewall of the substrate indentation 132 in FIGS. 7 and 8 because of the dielectric liner layer 134, which is made of a dielectric material. In FIG. 7, the metal film 136 reacts with the silicon substrate 100, so the silicide layer 138 is also formed at the interface between the metal film 136 and the wafer substrate 100. In FIG. 8, the metal film 136 does not react with the $SiO_2$ substrate 100, so the silicide layer 138 is formed only on the silicon-containing feature 116, which is exposed at the bottom of the substrate indentation 132.

In accordance with some embodiments, after the deposition of the metal film 136, a nitridation process is performed in step S6 to transform the metal film 136 into a metal nitride layer, so as to prevent underlayer oxidation. The nitridation process may involve a plasma treatment that uses a gas including nitrogen, other suitable techniques, or any combination thereof. In accordance with some embodiments, the plasma treatment may be performed using, for example, $N_2$ plasma, $N_2/H_2$ plasma, other suitable techniques, or any combination thereof.

Figure 9:
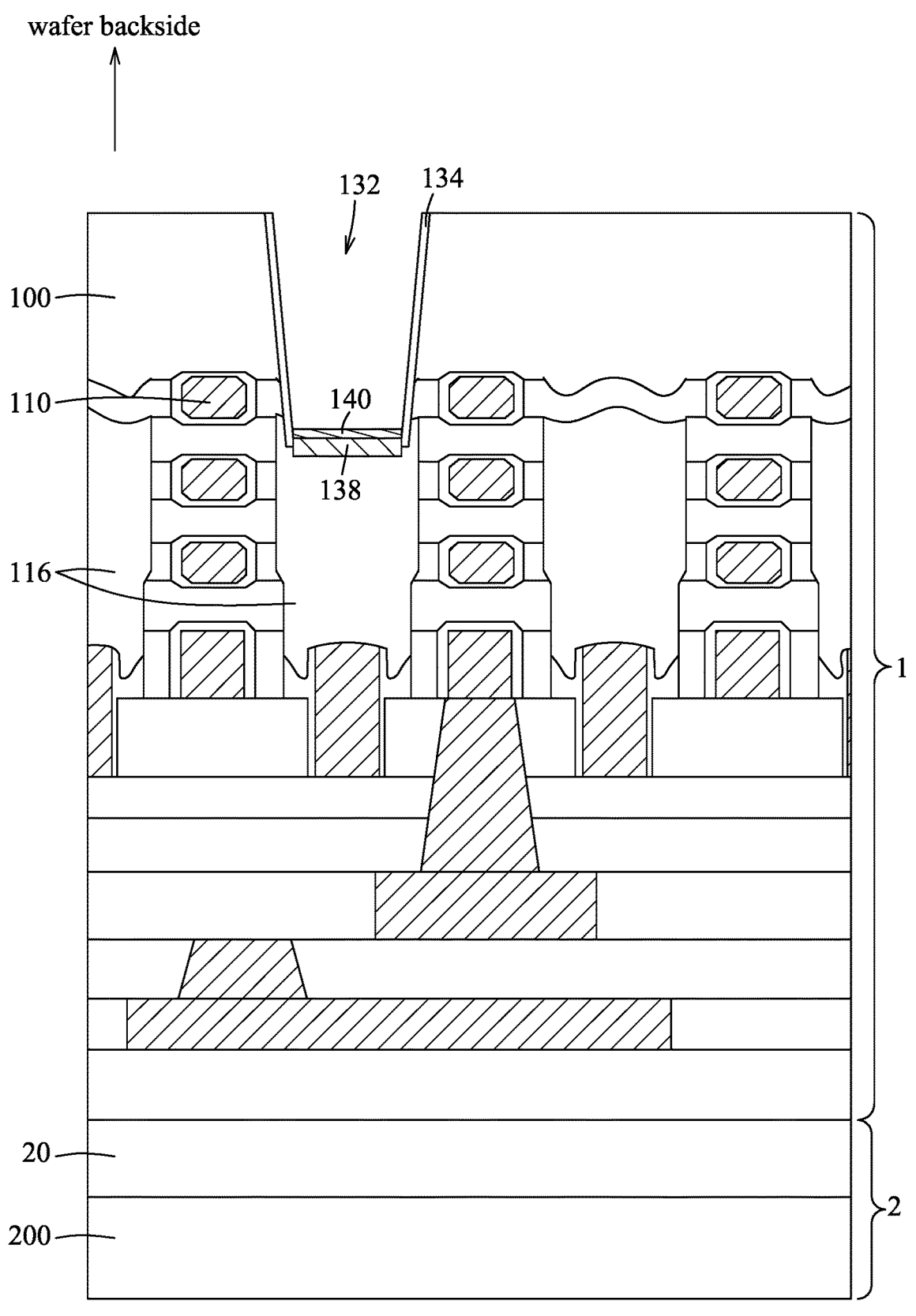

Referring to FIGS. 1 and 9, the metal nitride layer is etched to remove a portion of the metal nitride layer that is outside of the substrate indentation 132 and a portion of the metal nitride layer that is disposed on the sidewall of the substrate indentation 132, while a portion of the metal nitride layer (referred to as protective layer 140 hereafter) that is disposed at the bottom of the substrate indentation 132 and over the silicide layer 138 remains. In accordance with some embodiments, the metal nitride layer may be etched using isotropic dry etching, other suitable techniques, or any combination thereof. The isotropic dry etching may use a chlorine-based etchant, such as $BCl_3$, but this disclosure is not limited in the respect. Because of the high aspect ratio of the substrate indentation 132, the etching process can be controlled such that the protective layer 140 is not removed by the isotropic etching and remains over the silicide layer 138 to prevent the silicide layer 138 from oxidation. Since the silicide layer 138 and the protective layer 140 are both formed through transforming the metal film 136, the silicide layer 138 and the protective layer 140 have the same metal element. In the case that the wafer substrate 100 is a silicon substrate, a portion of the silicide layer 138 that is formed over the top surface of the substrate 100 (see FIG. 7) may be removed after the etching of the metal nitride layer using, for example, wet etching, dry etching, other suitable techniques, or any combination thereof. In accordance with some embodiments, the silicide layer 138 formed at the bottom of the substrate indentation 132 may have a thickness in a range from about 3 nm to about 6 nm, and the protective layer 140 may have a thickness in a range from about 1 nm to about 2 nm, but this disclosure is not limited in this respect. An excessively thick protective layer 140 (e.g., greater than 2 nm in thickness) may result in undesired large electrical resistance between the subsequently formed memory device and the silicon-containing feature 116, and an excessively thin protective layer 140 (e.g., smaller than 1 nm in thickness) may not effectively prevent underlayer oxidation.

Figure 10:
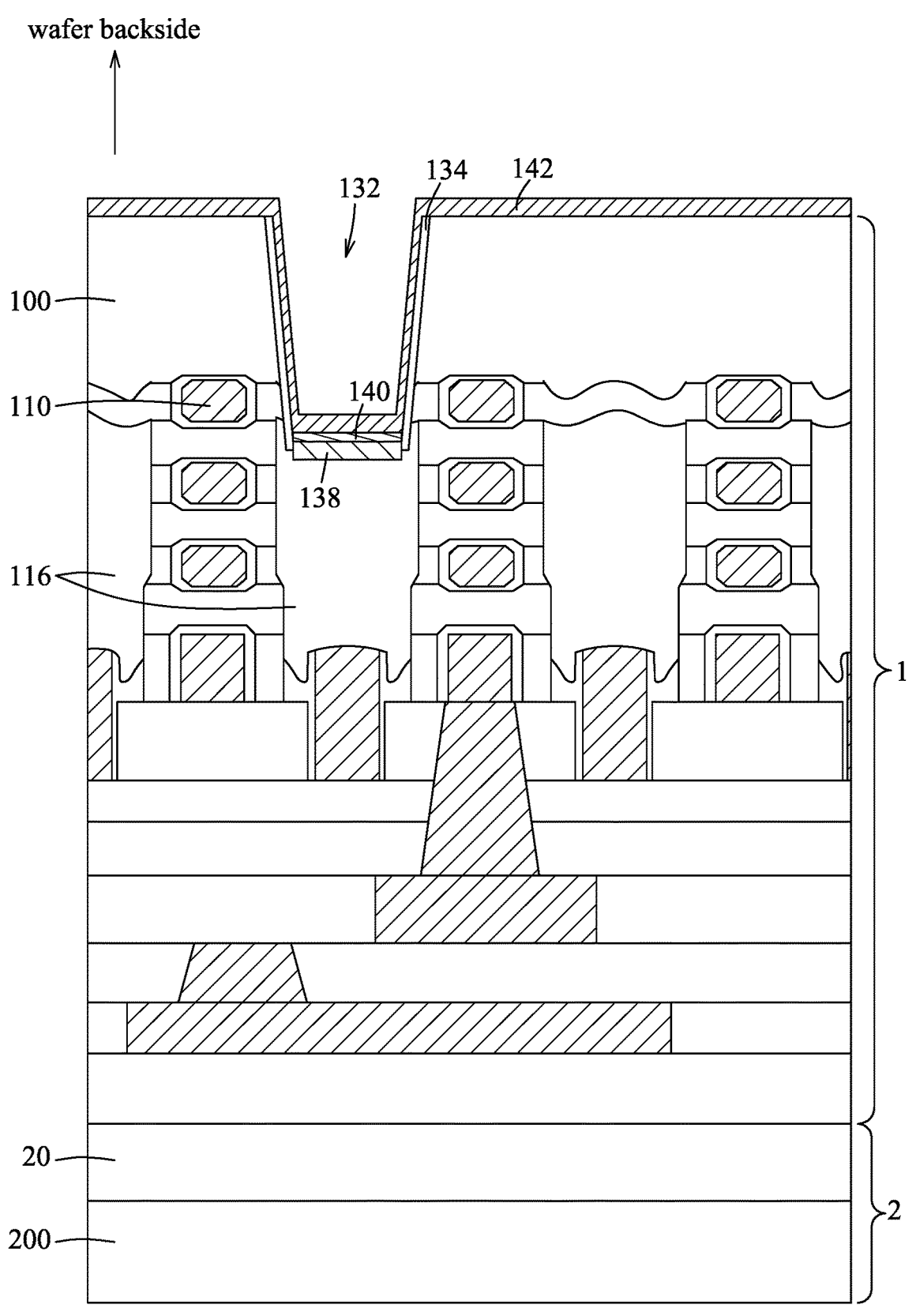
Figure 11:
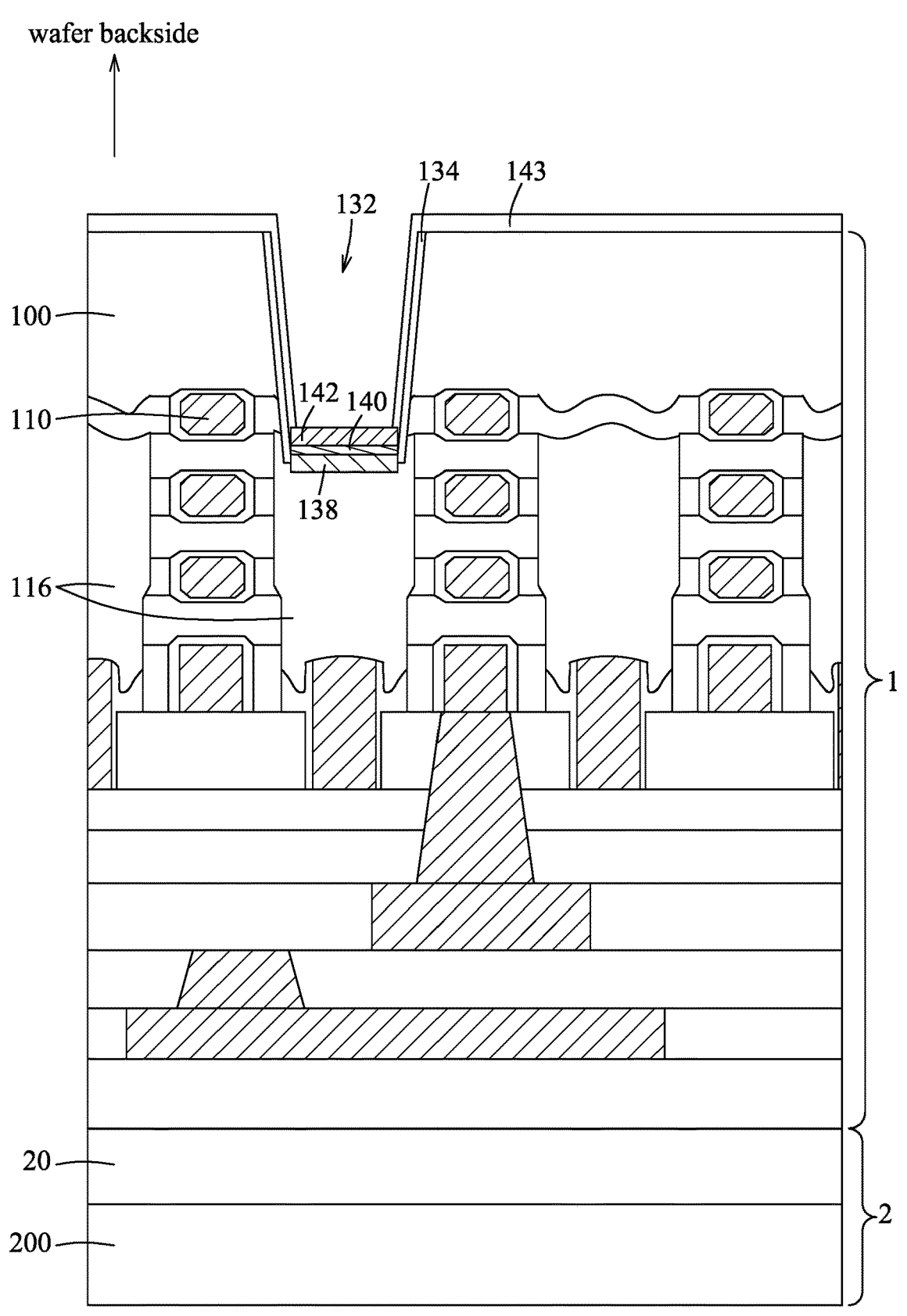
Figure 12:
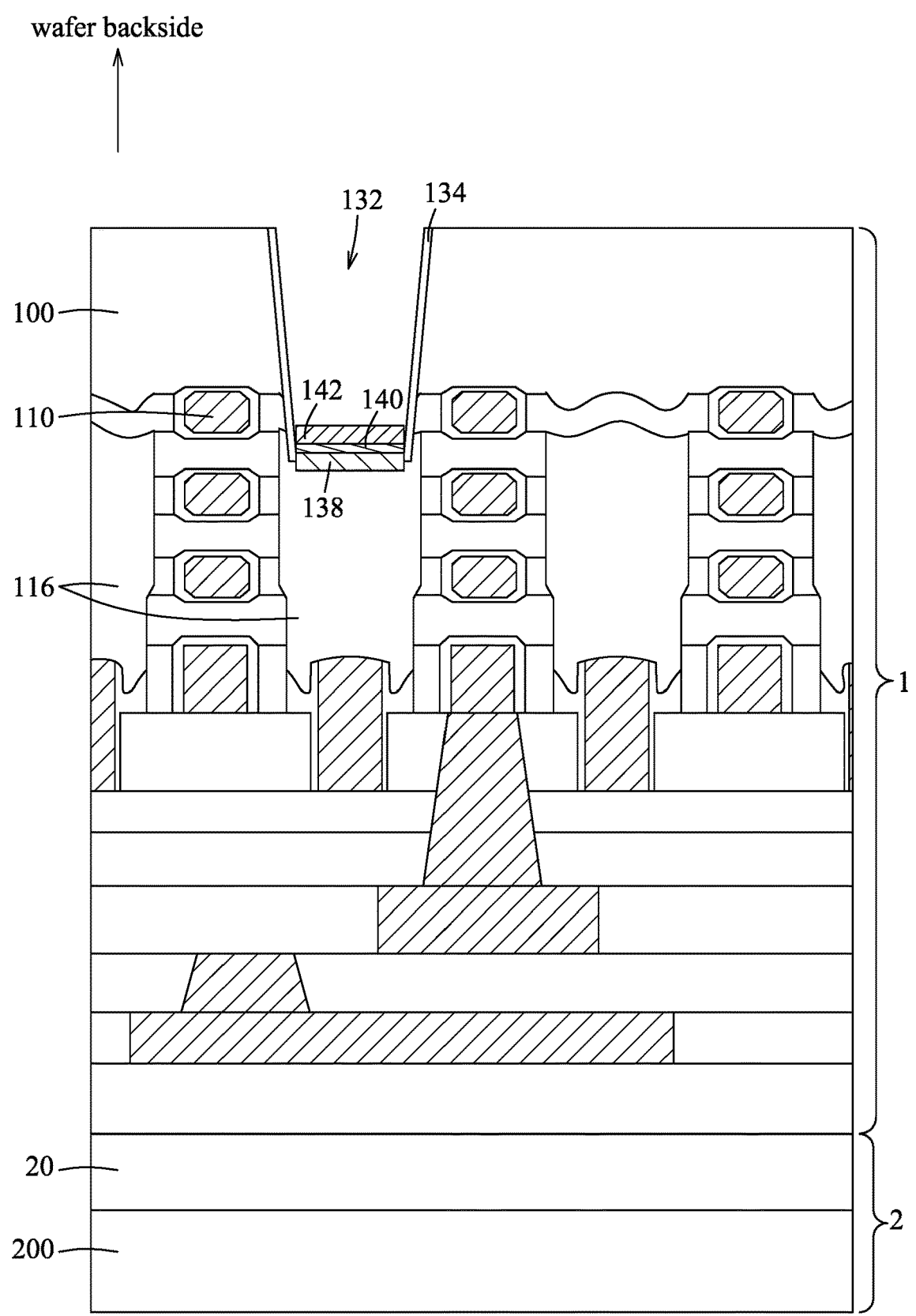

Referring to FIGS. 1 and 10 through 12, in step S7, a first electrode 142 of the memory device is formed over the silicide layer 138 and the protective layer 140. In FIG. 10, a first electrode layer (also denoted by the reference numeral 142) is conformally deposited over the backside portion of the wafer substrate 100 and in the substrate indentation 132. In accordance with some embodiments, the first electrode layer 142 may include, for example, TiN, TaN, WN, other suitable materials, or any combination thereof, and may be formed using, for example, directional PVD, other suitable techniques, or any combination thereof, so that the first electrode layer 142 is thick at the bottom of the substrate indentation 132 and is thin on the sidewall of the substrate indentation 132. In accordance with some embodiments, a portion of the first electrode layer 142 at the bottom of the substrate indentation 132 may have a thickness in a range from about 5 nm to about 20 nm. An excessively thick first electrode layer 142 (e.g., greater than 20 nm at the bottom of the substrate indentation 132) may result in undesired high electrical resistance, and an excessively thin first electrode layer 142 (e.g., smaller than 5 nm at the bottom of the substrate indentation 132) may result in great difficulty in terms of manufacturing process control. FIGS. 11 and 12 illustrate an exemplary pull-back process to form the first electrode layer 142 as shown in FIG. 10 into the first electrode 142 as shown in FIG. 12. In FIG. 11, a portion of the first electrode layer 142 that is outside of the substrate indentation 132 and a portion of the first electrode layer 142 that is over the sidewall of the substrate indentation 132 is transformed into a metal oxide layer 143 (e.g., including $TiO_2$ and/or TiON when the first electrode layer 142 is a TiN layer). In accordance with some embodiments, the metal oxide layer 143 may be formed by performing a plasma treatment (e.g., $O_2$ plasma) that uses a gas including oxygen on the first electrode layer 142, other suitable techniques, or any combination thereof. In accordance with some embodiments, the plasma treatment is performed with zero bias to make the plasma treatment non-directional, so that, in view of the high aspect ratio of the substrate indentation 132, a portion of the first electrode layer 142 that is disposed at the bottom of the substrate indentation 132 will not be oxidized. In FIG. 12, the metal oxide layer 143 is removed, and only the portion of the first electrode layer 142 that is disposed at the bottom of the substrate indentation 132 remains on the metal nitride layer 140, and serves as the first electrode 142 of the memory device that is completely disposed in the substrate indentation 132. In accordance with some embodiments, the metal oxide layer 143 may be removed using, for example, isotropic dry etching, other suitable techniques, or any combination thereof. The isotropic dry etching may use, for example, a chlorine-based etchant, but this disclosure is not limited in this respect.

Figure 13:
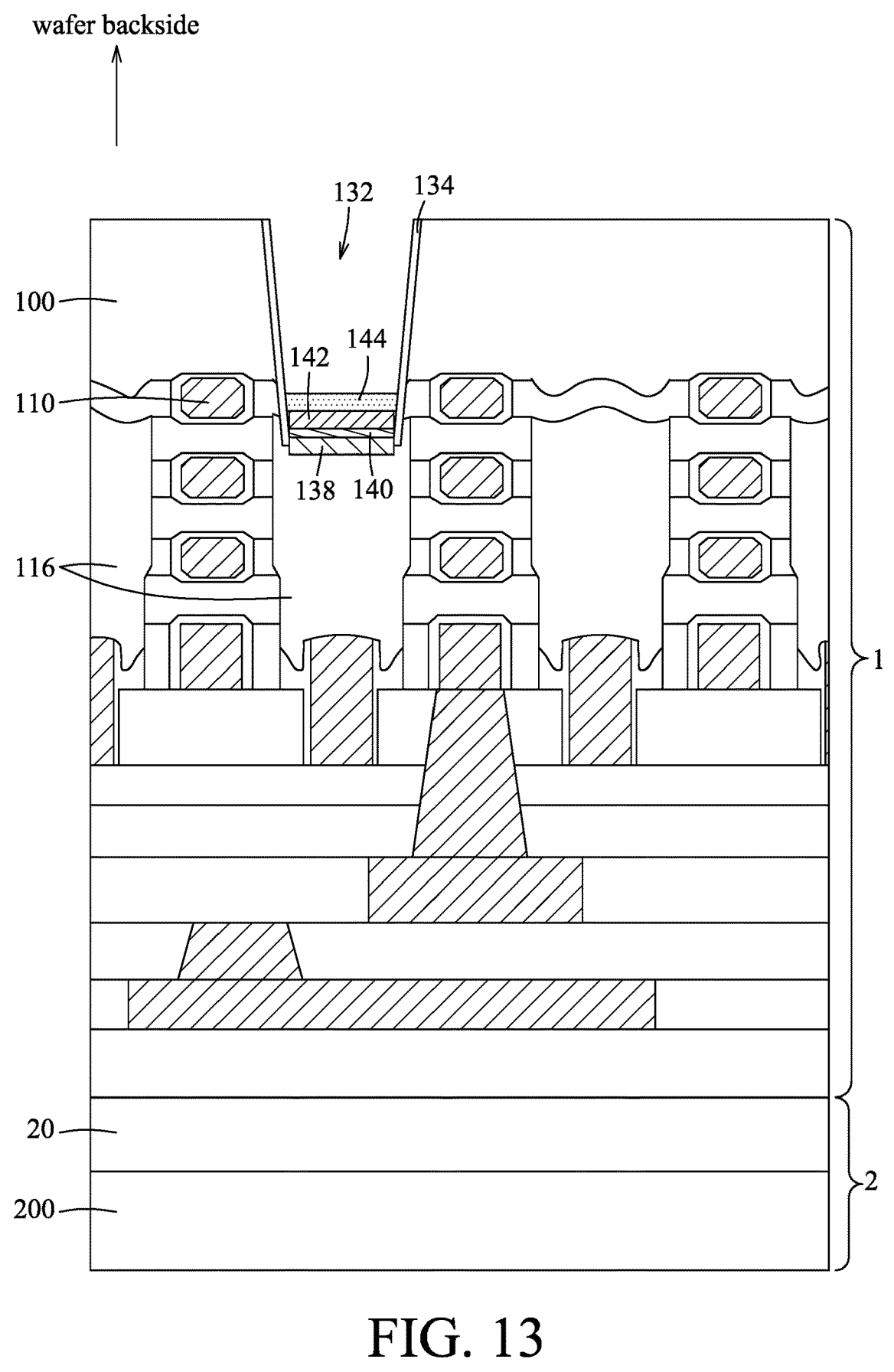

Referring to FIGS. 1 and 13, in step S8, a data-storage dielectric feature 144 is formed over the first electrode 142. In accordance with some embodiments where the memory device is an RRAM device, the data-storage dielectric feature 144 may include, for example, $HfO_2$, HfZrO, $Ta_2O_5$, $ZrO_2$, $TiO_2$, other suitable materials, or any combination thereof. In accordance with some embodiments where the memory device is a DRAM device, the data-storage dielectric feature 144 may include, for example, $HfO_2$, HfZrO, HfAlO, a high-k material that has a dielectric constant greater than 3.9, other suitable materials, or any combination thereof. In accordance with some embodiments where the memory device is an FeRAM device, the data-storage dielectric feature 144 may include, for example, strontium bismuth tantalite (SBT), lead zirconate titanate (PZT), hafnium zirconium oxide (HZO), binary oxide (e.g., hafnium oxide ($HfO_2$)), ternary oxide (e.g., hafnium silicate (Hf-$SiO_x$), hafnium zirconium oxide ($HfZrO_x$), barium titanate ($BaTiO_3$), lead titanate ($PbTiO_3$), strontium titanate (Sr-$TiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN)), quaternary oxides (e.g., barium strontium titanate (BaSr-TiOx)), other suitable ferroelectric material(s), or any combination thereof. The hafnium oxide may be doped using, for example, zirconium (Zr), silicon (Si), yttrium (Y), aluminum (Al), gadolinium (Gd), lanthanum (La), strontium (Sr), other suitable materials, or any combination thereof. In accordance with some embodiments where the memory device is an FeRAM device and the data-storage dielectric feature 144 is made of hafnium zirconium oxide ($HfZrO_x$), the hafnium zirconium oxide in the data-storage dielectric feature 144 may have an orthorhombic phase, and an atomic percentage of Zr in the hafnium zirconate may range from about 30% to about 60%, so that a data state of the data-storage dielectric feature 144 can be controlled to switch between logic 0 and logic 1 in a desired manner. In accordance with some embodiments, the data-storage dielectric feature 144 may be formed by depositing a data-storage dielectric layer on the backside portion of the wafer substrate 100 and in the substrate indentation 132, and performing a subsequent pull-back process where a portion of the data-storage dielectric layer that is disposed outside the substrate indentation 132 and a portion of the data-storage dielectric layer that is disposed over the sidewall of the substrate indentation 132 are removed, so the data-storage dielectric feature 144 is completely disposed in the substrate indentation 132. In accordance with some embodiments, the data-storage dielectric layer may be formed using, for example, directional PVD, CVD, ALD, other suitable techniques, or any combination thereof, and the pull-back process may be performed using, for example, wet etching, dry etching, RIE, IBE, atomic layer etching (ALE), other suitable techniques, or any combination thereof. In accordance with some embodiments, the data-storage dielectric feature 144 may have a thickness in a range from about 3 nm to about 6 nm, so that the data state of the data-storage dielectric feature 144 can be controlled to switch between logic 0 and logic 1 in a desired manner.

Figure 14:
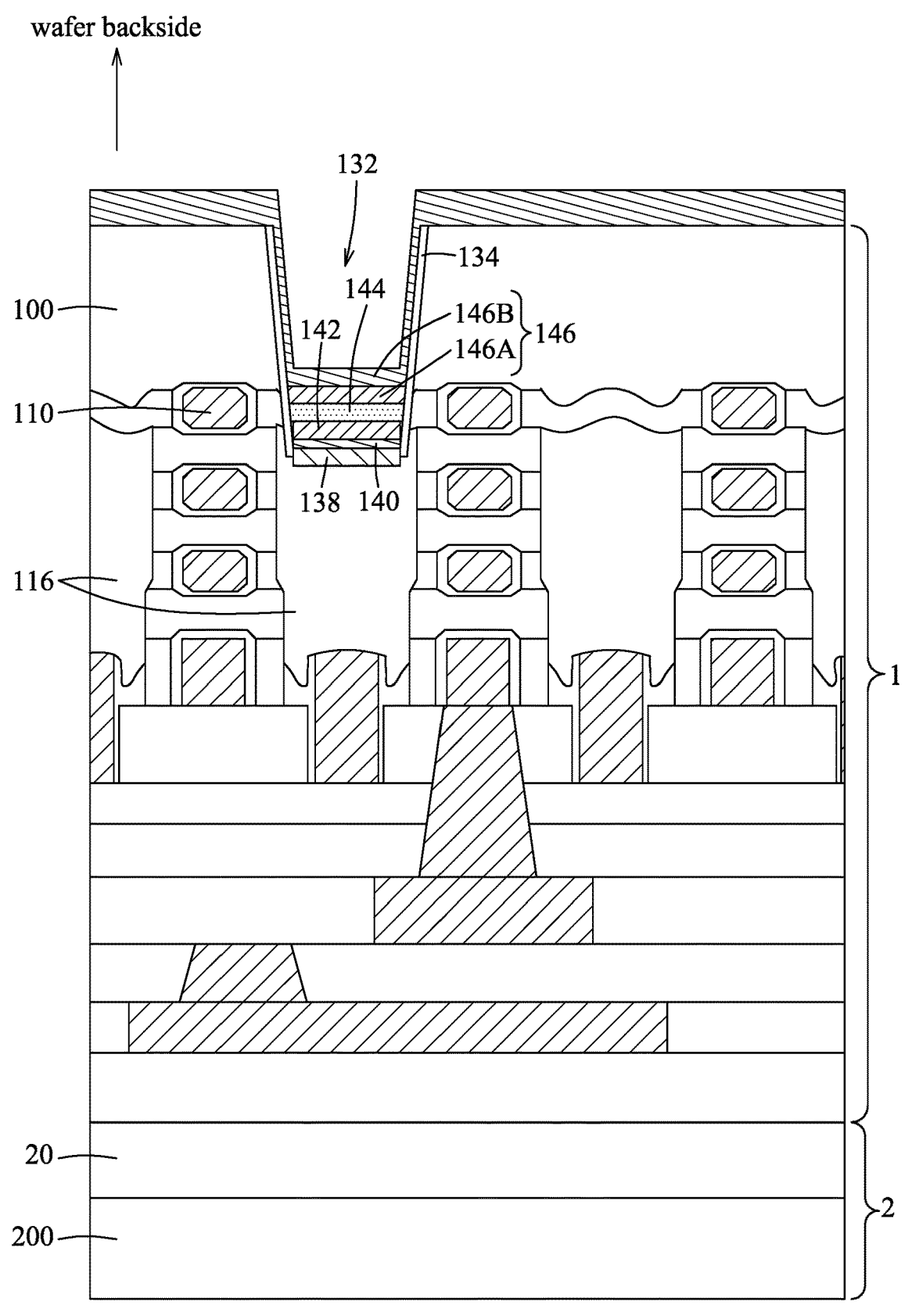

Referring to FIGS. 1 and 14, in step S9, a second electrode 146 of the memory device is formed over the data-storage dielectric feature 144. In accordance with some embodiments where the memory device requires a top electrode to have a portion that is in contact with the data-storage dielectric feature 144 (for example but not limited to, an RRAM device) and that is different from the first electrode 142 in terms of material to result in oxygen vacancies in the data-storage dielectric feature 144 when an appropriate voltage is applied between the first electrode 142 and the second electrode 146, the second electrode 146 may include a lower portion 146A that is in contact with the data-storage dielectric feature 144 and that is different from the first electrode 142 in terms of material, and an upper portion 146B that is disposed over and in contact with the lower portion 146A. In such a scenario, a second electrode layer, which is a metal layer (e.g., Ti layer, Ta layer, W layer, or other suitable metal layer), may be formed over the backside portion of the wafer substrate 100 and in the substrate indentation 132 using, for example, PVD, directional PVD, CVD, ALD, other suitable techniques, or any combination thereof. Then, a nitridation process is performed using, for example, $NH_3$, $N_2/H_2$ plasma, other suitable materials and/or techniques, or any combination thereof, to transform an upper portion of the second electrode layer (which includes a portion of the second electrode layer that is outside of the substrate indentation 132, a portion of the second electrode layer that is over the sidewall of the substrate indentation 132, and an upper part of a portion of the second electrode layer that is disposed at the bottom of the substrate indentation 132 in the illustrative embodiment) into a metal nitride portion, so as to form the upper portion 146B of the second electrode 146 as illustrated in FIG. 14. On the other hand, because of a lower nitridation rate at the bottom of the substrate indentation 132, a lower part of the portion of the second electrode layer that is disposed at the bottom of the substrate indentation 132 remains to be metal after the nitridation process, thereby forming the lower portion 146A of the second electrode 146, which is a metal portion that includes, for example, Ti, Ta, W, other suitable materials, or any combination thereof. In accordance with some embodiments where the memory device does not require a top electrode to have a portion that is different from the first electrode 142 in terms of material (e.g., a DRAM device, an FeRAM device, etc.), the second electrode layer may be a metal nitride layer that includes, for example, TiN, TaN, WN, other suitable materials, or any combination thereof. The metal nitride layer may be deposited using, for example, PVD, directional PVD, CVD, ALD, other suitable techniques, or any combination thereof, and no additional nitridation process is required, so the lower portion 146A and the upper portion 146B of the second electrode 146 are made of the same material.

Figure 15:
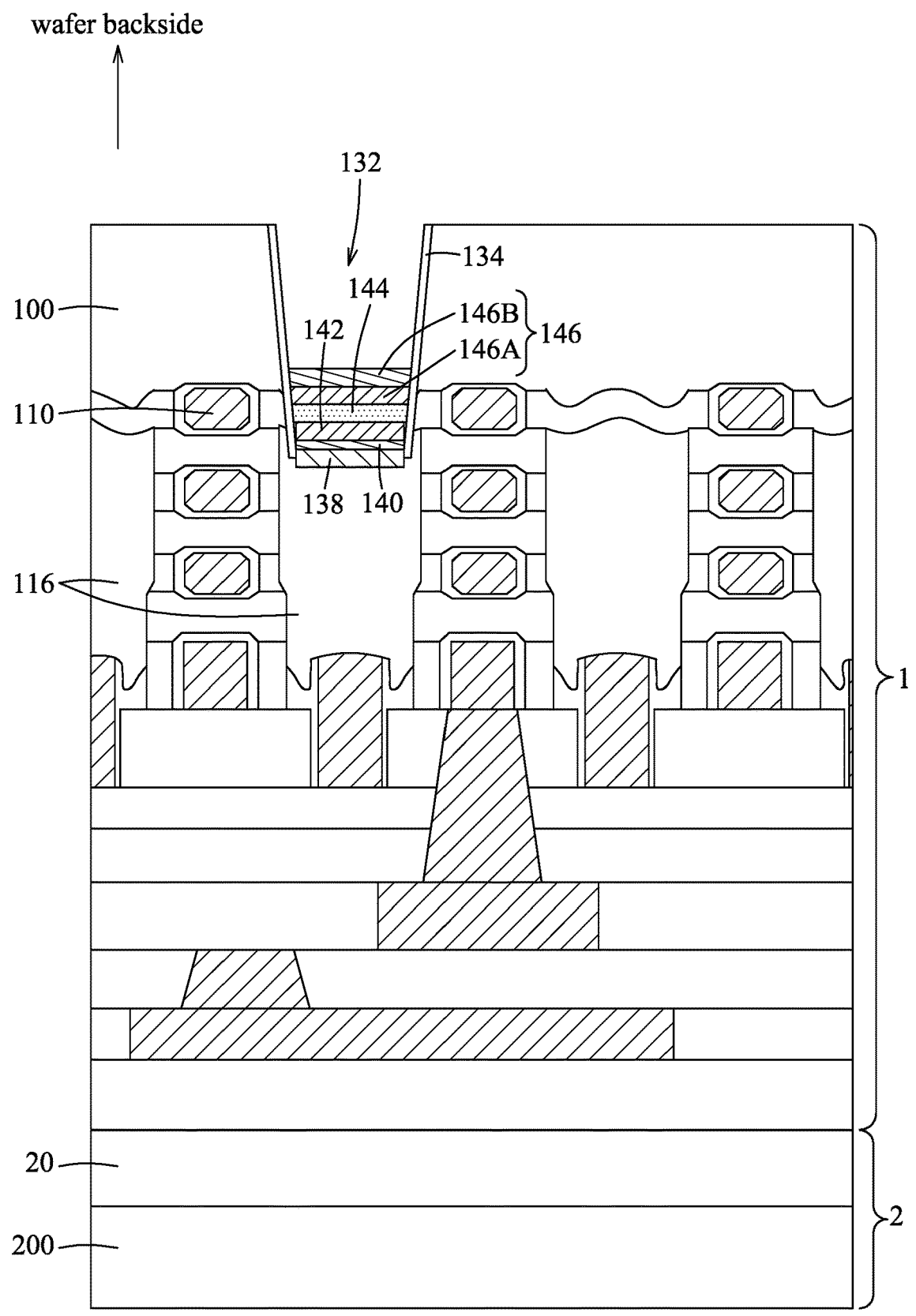

Referring to FIG. 15, a portion of the second electrode 146 that is outside of the substrate indentation 132, and a portion of the second electrode 146 that is disposed over the sidewall of the substrate indentation 132 are removed. In accordance with some embodiments, the removal may be similar to the pull-back process as described for FIGS. 11 and 12, and details thereof are omitted herein for the sake of brevity.

Figure 16:
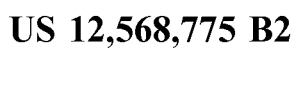

Referring to FIG. 16, a glue layer 148 is deposited over the backside portion of the wafer substrate 100 and in the substrate indentation 132, and a metal filling layer 150 is deposited over the glue layer 148 and the second electrode layer 146 to fill the substrate indentation 132. The glue layer 148 may include, for example, TiN, TaN, WN, other suitable materials, or any combination thereof, and may be deposited using, for example, CVD, PVD, ALD, other suitable techniques, or any combination thereof. The metal filling layer 150 may include, for example, W, Mo, Ru, Co, other suitable materials, or any combination thereof, and may be deposited using, for example, CVD, other suitable techniques, or any combination thereof. In accordance with some embodiments, the process step as described for FIG. 15 may be omitted to maintain the portion of the second electrode 146 that is outside of the substrate indentation 132 and the portion of the second electrode 146 that is disposed over the sidewall of the substrate indentation 132, so the upper portion 146B of the second electrode 146 can serve as the glue layer for growth of the metal filling layer 150, and the deposition of the glue layer 148 can be omitted.

Figure 17:
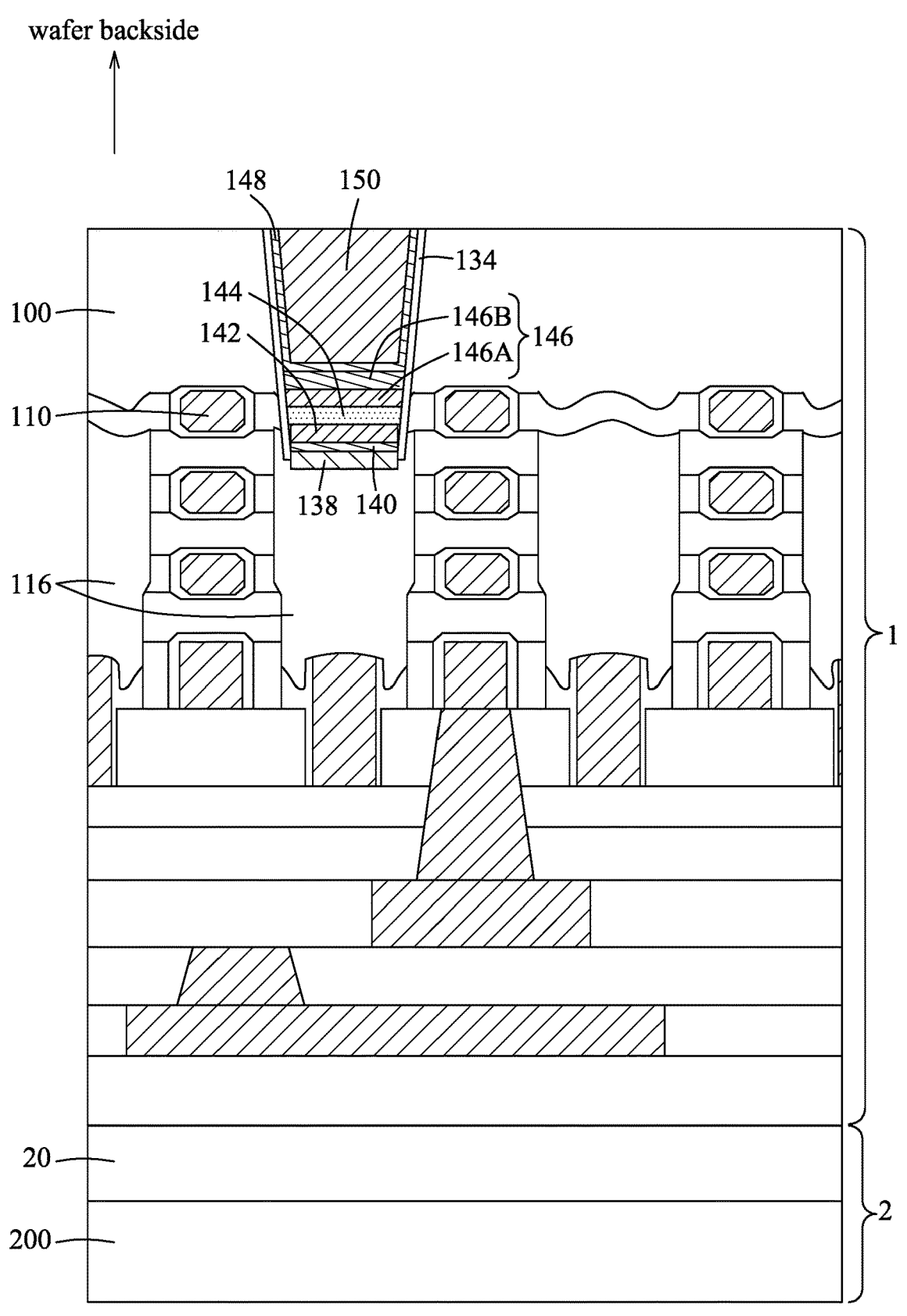

Referring to FIG. 17, a chemical-mechanical planarization (CMP) process is performed to planarize and reveal the top surface of the wafer substrate 100, and the metal filling layer 150 forms a metal feature (also denoted by the reference numeral 150 herein) after the CMP process.

Figure 18:
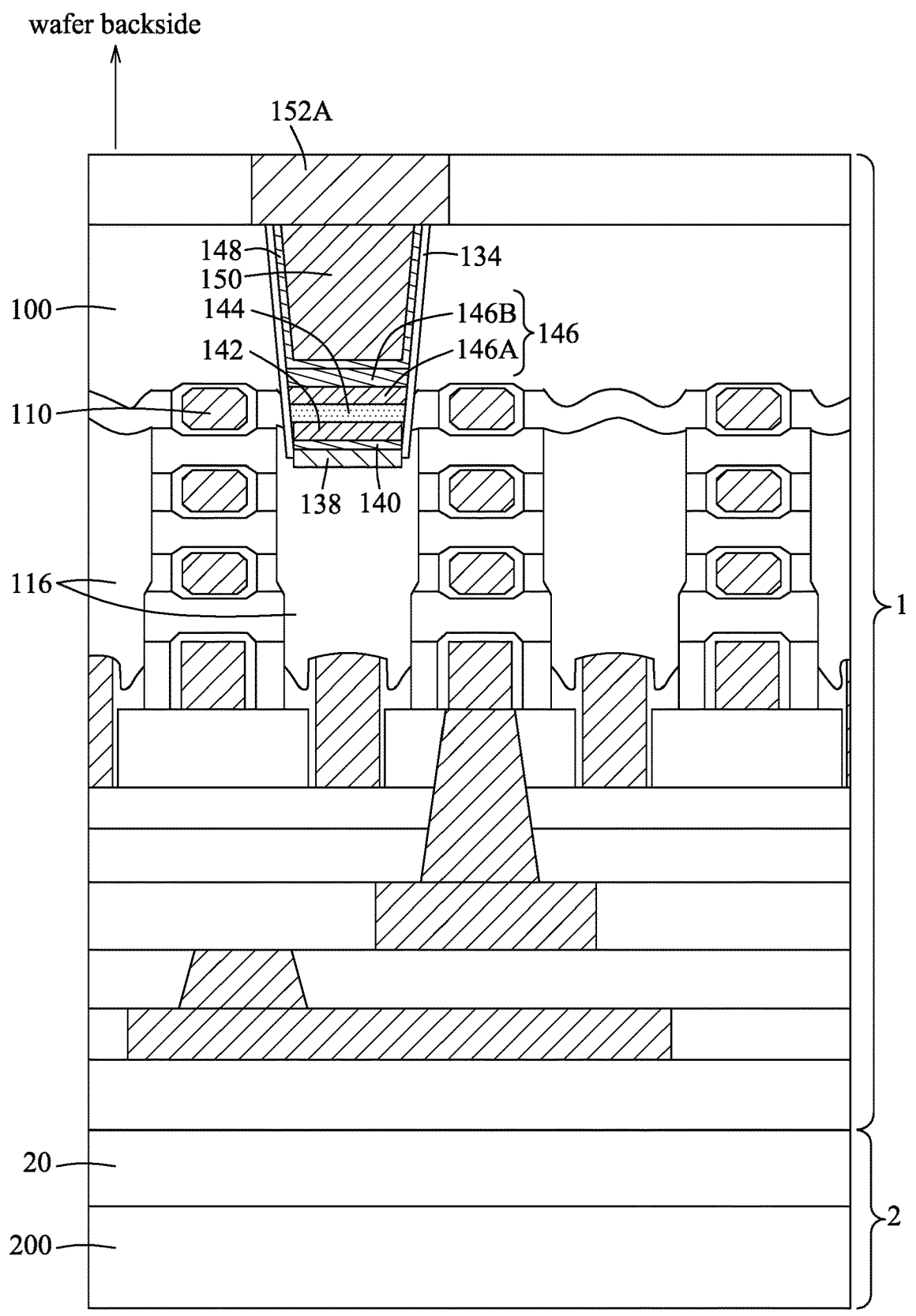
Figure 19:
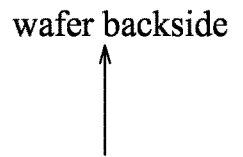
Figure 20:
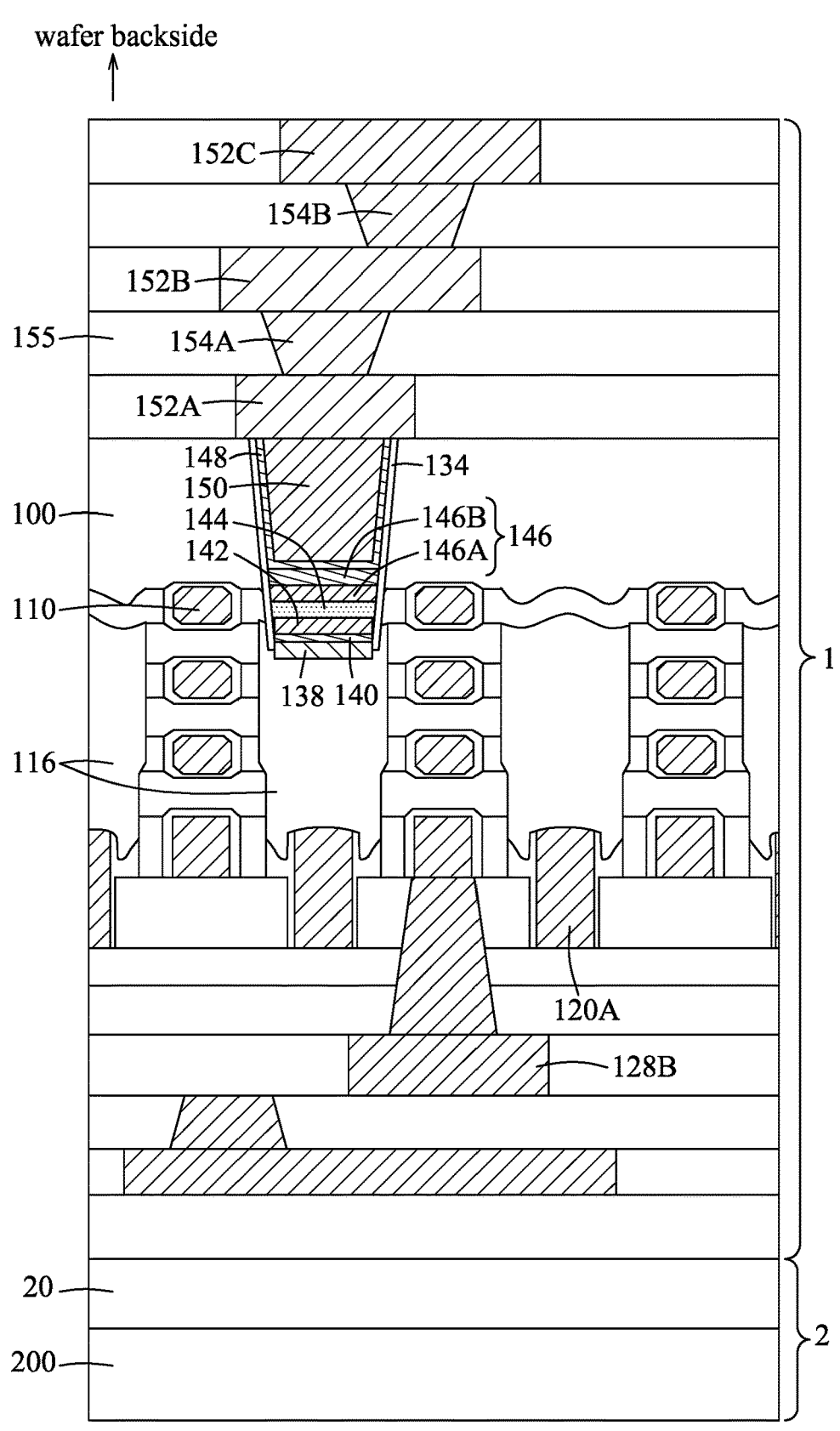

Referring to FIGS. 18 through 20, a plurality of metal wire layers are exemplarily formed above the memory device and the semiconductor devices when the backside direction is considered the upward direction. In FIG. 18, a first metal wire layer 152A is formed to include a wire that is in contact with the metal filling layer 150. In FIG. 19, a second metal wire layer 152B is formed to include a wire that is electrically connected to the first metal wire layer 152A through a first contact via 154A. In FIG. 20, a third metal wire layer 152C is formed to include a wire that is electrically connected to the second metal wire layer 152B through a second contact via 154B. In accordance with some embodiments, the metal wire layers 152A, 152B, 152C and the contact vias 154A, 154B may include, for example, Co, W, Ru, Cu, Al, Mo, Ti, Ni, Au, Pt, Pd, other suitable materials, or any combination thereof, and are formed in a backside interlayer dielectric 155. In accordance with some embodiments, the backside interlayer dielectric 155 may include, for example, silicon oxide, silicon nitride, silicon oxynitride, silicon carbonitride, silicon carbide oxynitride, SOG, PSG, BPSG, FSG, carbon doped silicon oxide (e.g., SiCOH), polyimide, other suitable materials, or any combination thereof. In accordance with some embodiments, the metal wire layers 152A, 152B, 152C may include power rails for transmission of electrical power to the semiconductor devices that are formed at the frontside of the wafer substrate 100.

As a result, a memory cell is formed on the wafer substrate 100 to include one semiconductor device, and one memory device that is electrically connected to one of the source/drain features 116 of the semiconductor device in FIG. 20. The memory device includes the first electrode 142 that is electrically connected to the semiconductor device, the data-storage dielectric feature 144 that is disposed above the first electrode 142 when the backside direction is considered the upward direction, and the second electrode 146 that is disposed above the data-storage dielectric feature 144 when the backside direction is considered the upward direction. In the illustrative embodiment, the dielectric liner layer 134 is disposed between the memory device and the wafer substrate 100, and each of the first electrode 142, the data-storage dielectric feature 144 and the second electrode 146 is in contact with the dielectric liner layer 134. The metal feature 150 is disposed above the second electrode 146 when the backside direction is considered the upward direction. In accordance with some embodiments, the second electrode 146 has a metal portion (e.g., the lower portion 146A) that is in contact with the data-storage dielectric feature 144, and a metal nitride portion (e.g., the upper portion 146B) that is disposed between the metal portion thereof and the metal feature 150, and the metal portion and the metal nitride portion of the second electrode 146 include the same metal element. In accordance with some embodiments, the second electrode 146 is simply a metal nitride layer.

In the illustrative embodiment, the substrate indentation 132 (see FIGS. 4 through 12) has an aspect ratio (e.g., a height-to-width ratio) in a range from about 3 to about 8. If the aspect ratio is excessively small (e.g., smaller than 3), the portion of the to-be-processed layer (e.g., the first electrode layer, the data-storage dielectric layer, the second electrode layer, etc.) that is disposed at the bottom of the substrate indentation 132 may be removed during the corresponding pull-back process. In such a condition, the first electrode 142, the data-storage dielectric feature 144 and/or the second electrode 146 may not be successfully formed. If the aspect ratio is excessively large (e.g., greater than 8), the reactants for forming the silicide layer 138, the protective layer 140, the first electrode layer, the data-storage dielectric layer and/or the second electrode layer may not reach the bottom of the substrate indentation 132, resulting in a low yield.

In accordance with some embodiments, when the backside direction is considered the upward direction, a top opening of the substrate indentation 132 may have a width in a range from about 10 nm to about 50 nm. For the top opening of the substrate indentation 132, an excessively large width (e.g., greater than 50 nm) may increase difficulty in overlay control, and an excessively small width (e.g., smaller than 10 nm) may lead to difficulty in formation of the required films/layers at the bottom of the substrate indentation 132. In accordance with some embodiments, the bottom of the substrate indentation 132 may have a width in a range from about 8 nm to about 45 nm. For the bottom of the substrate indentation 132, an excessively large width (e.g., greater than 45 nm) may increase difficulty in overlay control, and an excessively small width (e.g., smaller than 8 nm) may lead to insufficient formation of the silicide layer 138, the first electrode 142, the data-storage dielectric feature 144 and the second electrode 146 at the bottom of the substrate indentation 132. In accordance with some embodiments, a height of the substrate indentation 132 may be determined based on the desired aspect ratio and the desired width for the top opening of the substrate indentation 132, and usually fall within a range from about 10 nm to about 80 nm.

Figure 21:
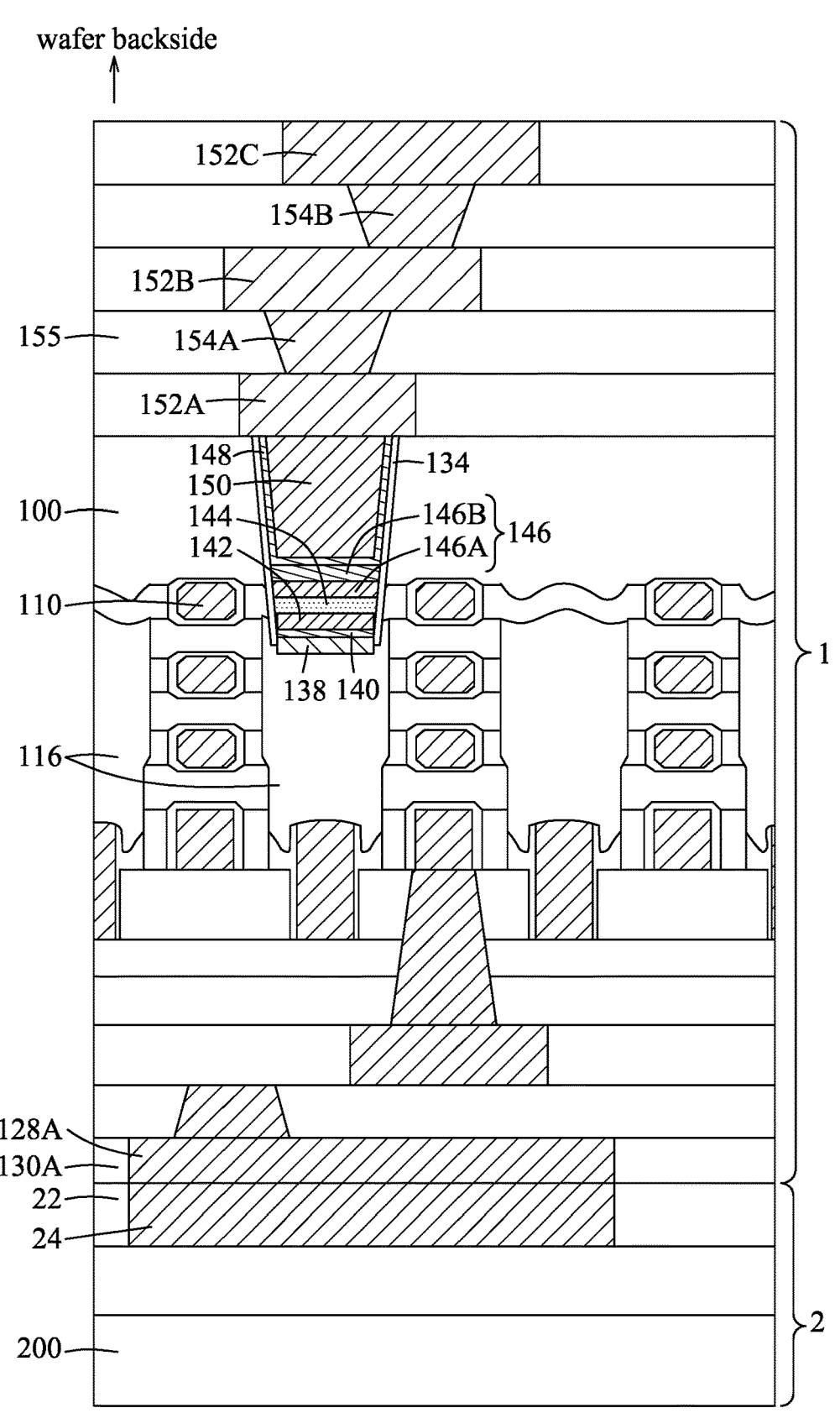
FIG. 21 is a schematic view illustrating a variation in accordance with some embodiments.

FIG. 21 illustrates a variation of a circuit structure of the embodiment as illustrate in FIG. 20. In FIG. 21, the device wafer 1 and the carrier wafer 2 are connected together by hybrid bonding. In such a scenario, the device wafer 1 has a frontside surface that is formed by a top metal layer 128A and a top dielectric layer 130A, the carrier wafer 2 has a frontside surface that is formed by a top metal layer 24 and a top dielectric layer 22, and the top metal layer 128A of the device wafer 1 is connected to the top metal layer 24 of the carrier wafer 2. In accordance with some embodiments, the top metal layers 128A, 24 of the device wafer 1 and the carrier wafer 2 may include, for example, Cu, other suitable materials, or any combination thereof. In accordance with some embodiments, the top dielectric layers 130A, 22 of the device wafer 1 and the carrier wafer 2 may include, for example, SiON, other suitable materials, or any combination thereof. In accordance with some embodiments, the top dielectric layer 22 of the carrier wafer 2 may have a thickness greater than 200 angstroms to achieve good bonding. Since the top metal layers 128A, 24 of the device wafer 1 and the carrier wafer 2 have good thermal conductivity, the hybrid bonding may be advantageous in terms of heat dissipation.

FIG. 22 illustrates an equivalent circuit of the memory cell when the memory device is an RRAM device that is electrically connected to one of the source/drain features 116 of the semiconductor device. Further referring to FIG. 20, a wire 128B serves as a word line (WL) and is electrically connected to the gate electrode feature 110, a wire 152B serves as a bit line (BL) and is electrically connected to second electrode 146 of the memory device, and a wire 120A serves as a source line (SL) and is electrically connected to the other one of the source/drain features 116 of the semiconductor device.

FIG. 23 illustrates an equivalent circuit of the memory cell when the memory device is a DRAM device that is electrically connected to one of the source/drain features 116 of the semiconductor device. Further referring to FIG. 20, the wire 128B serves as a word line (WL) and is electrically connected to the gate electrode feature 110, the wire 152B serves as a source line (SL) and electrically connects the second electrode 146 of the memory device to ground, and the wire 120A serves as a bit line (BL) and is electrically connected to the other one of the source/drain features 116 of the semiconductor device.

FIG. 24 illustrates an equivalent circuit of the memory cell when the memory device is an FeRAM device that is electrically connected to one of the source/drain features 116 of the semiconductor device. Further referring to FIG. 20, the wire 128B serves as a word line (WL) and is electrically connected to the gate electrode feature 110, the wire 152B serves as a source line (SL) and is electrically connected to the second electrode 146 of the memory device, and the wire

120A serves as a bit line (BL) and is electrically connected to the other one of the source/drain features 116 of the semiconductor device.

FIGS. 25 through 31 illustrate another implementation for forming the memory device.

Figure 25:
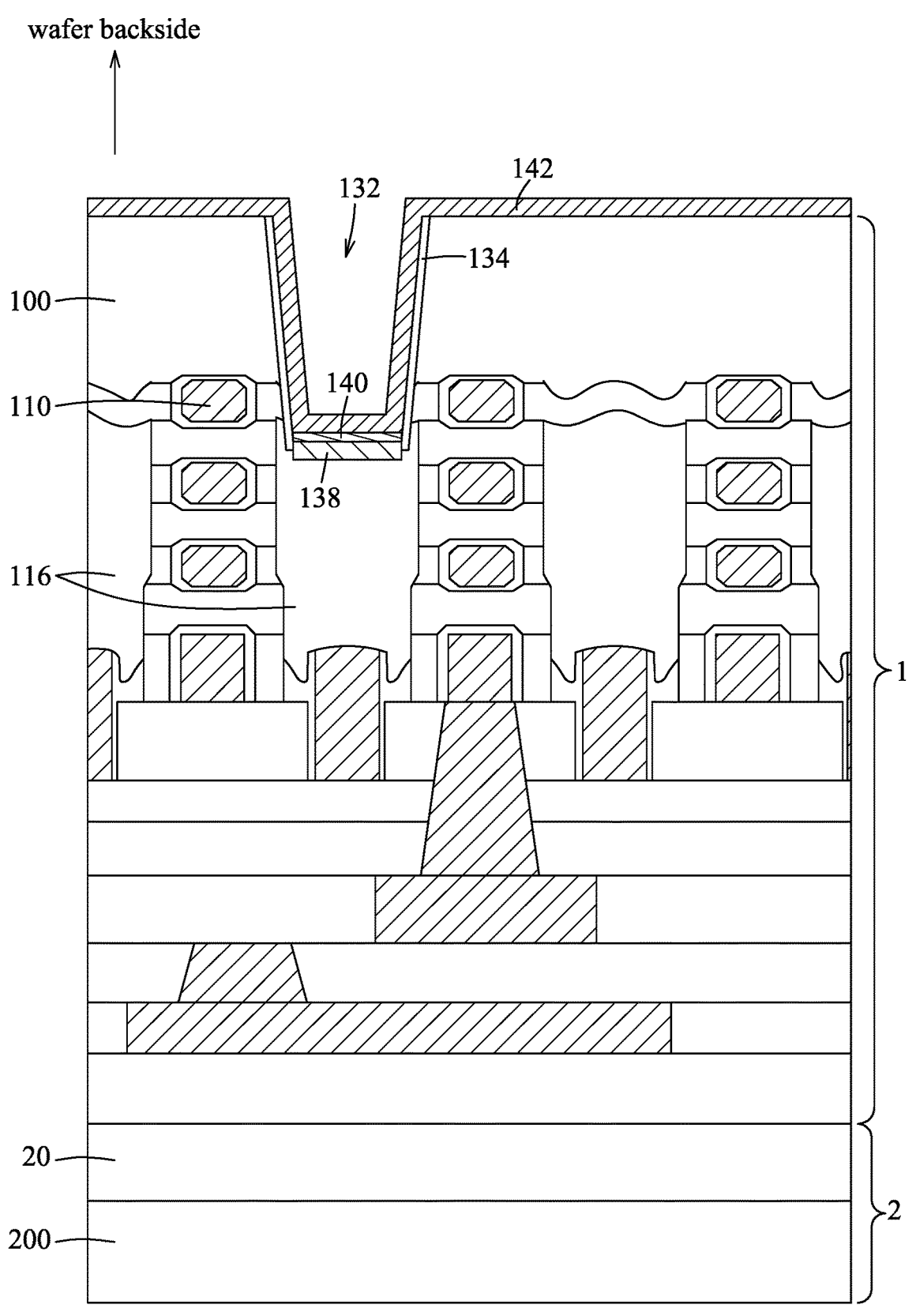
FIGS. 25 through 34 are schematic views illustrating the steps of the method in accordance with some other embodiments.

Referring to FIGS. 1 and 25, in step S7 that follows step S6, a first electrode layer 142 is conformally deposited over the backside portion of the wafer substrate 100 and in the substrate indentation 132. The first electrode layer 142 may be formed using, for example, ALD, other suitable techniques, or any combination thereof.

Figure 26:
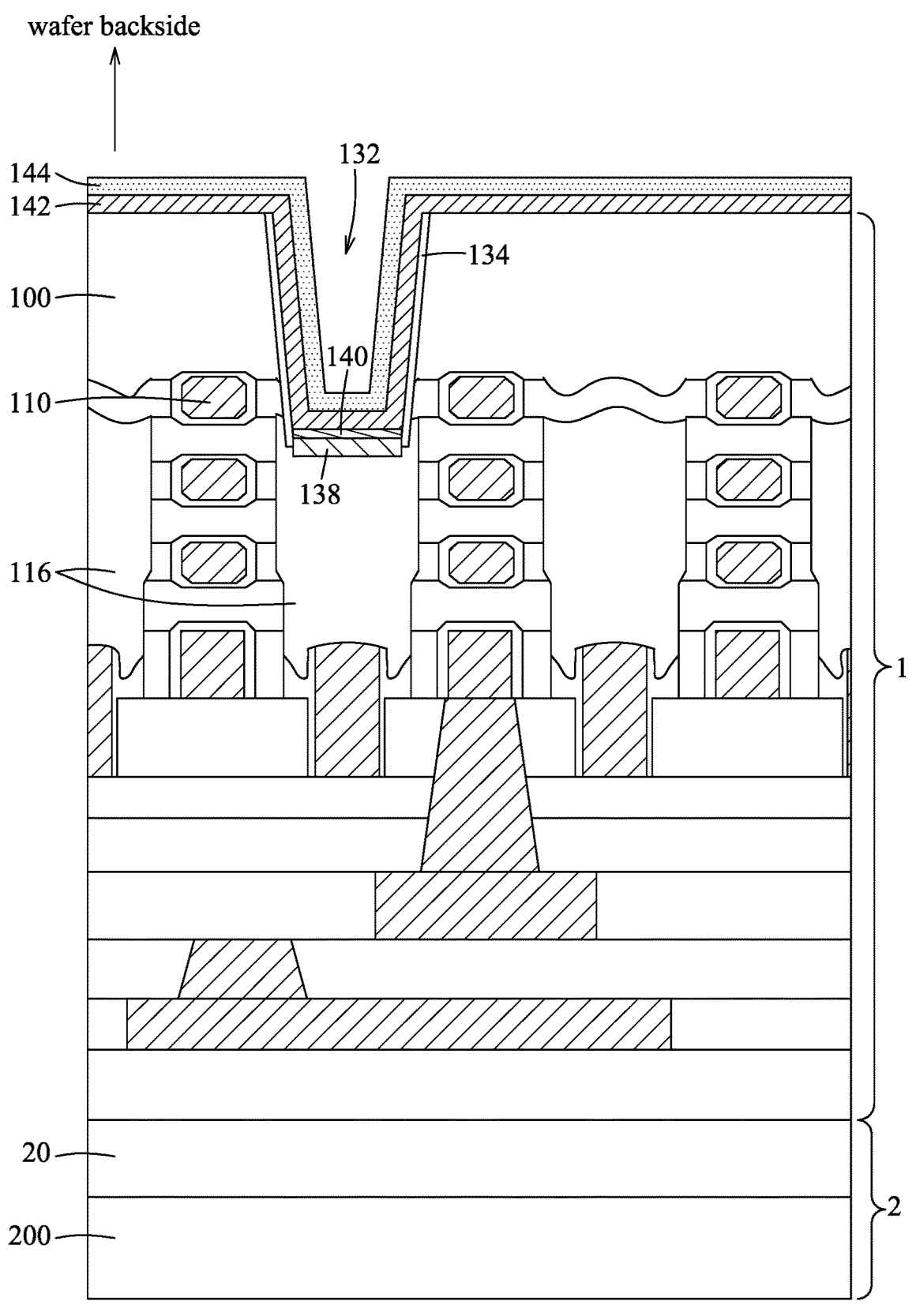

Referring to FIGS. 1 and 26, in step S8, a data-storage dielectric layer 144 is conformally deposited over the first electrode layer 142 and in the substrate indentation 132. The data-storage dielectric layer 144 may be formed using, for example, ALD, other suitable techniques, or any combination thereof.

Figure 27:
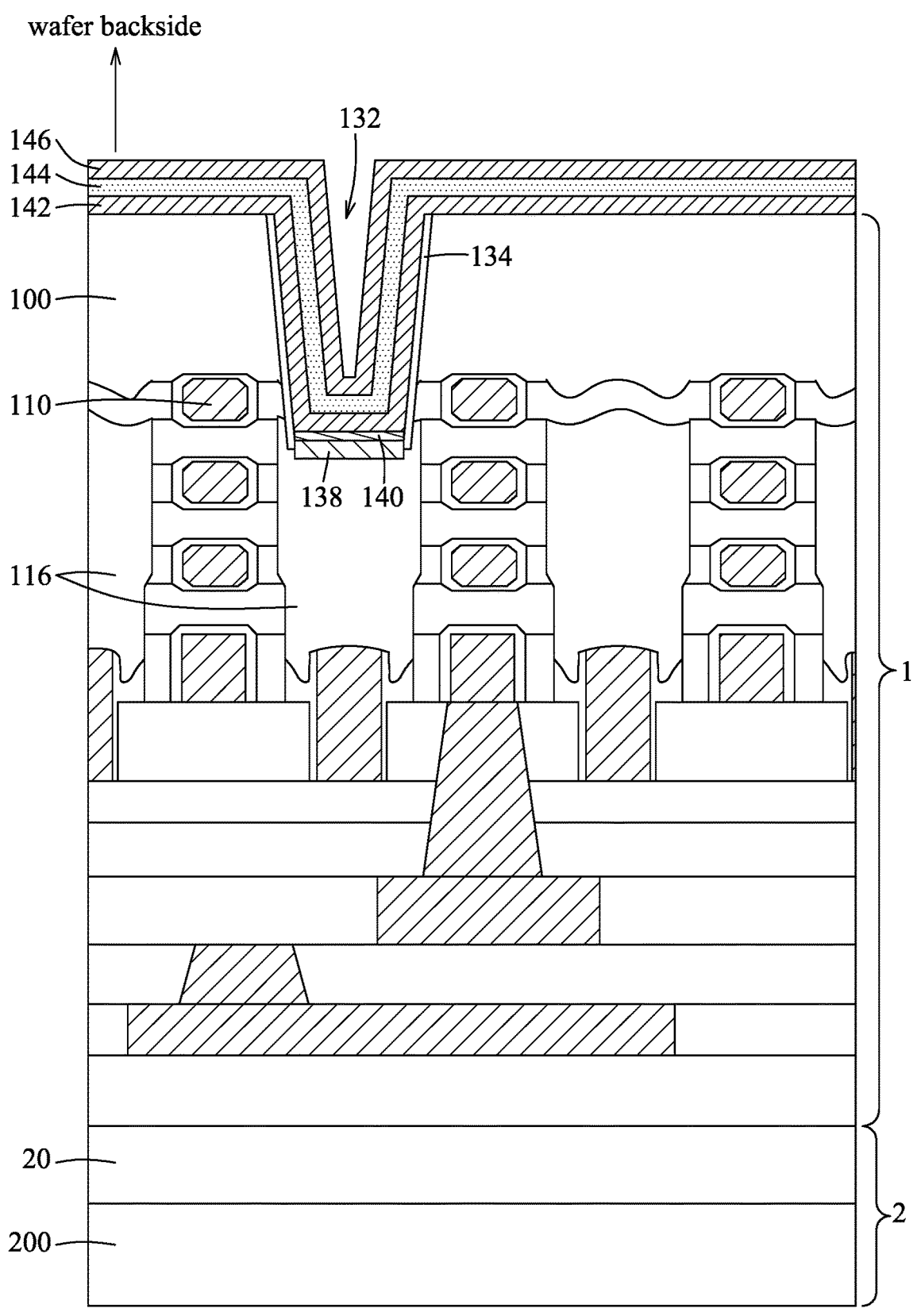

Referring to FIGS. 1 and 27, in step S9, a second electrode layer 146 is conformally deposited over the data-storage dielectric layer 144 and in the substrate indentation 132. The second electrode layer 146 may be formed using, for example, ALD, other suitable techniques, or any combination thereof. As mentioned earlier, when the memory device requires the top electrode to have a metal portion that is in contact with the data-storage dielectric feature 144, the second electrode layer 146 may be a metal layer, and a nitridation process may be subsequently performed to transform an upper portion of the second electrode layer 146 into a metal nitride portion. When the memory device does not require the top electrode to have a metal portion that is in contact with the data-storage dielectric feature 144, the second electrode layer 146 may be directly deposited to be a metal nitride layer.

Figure 28:
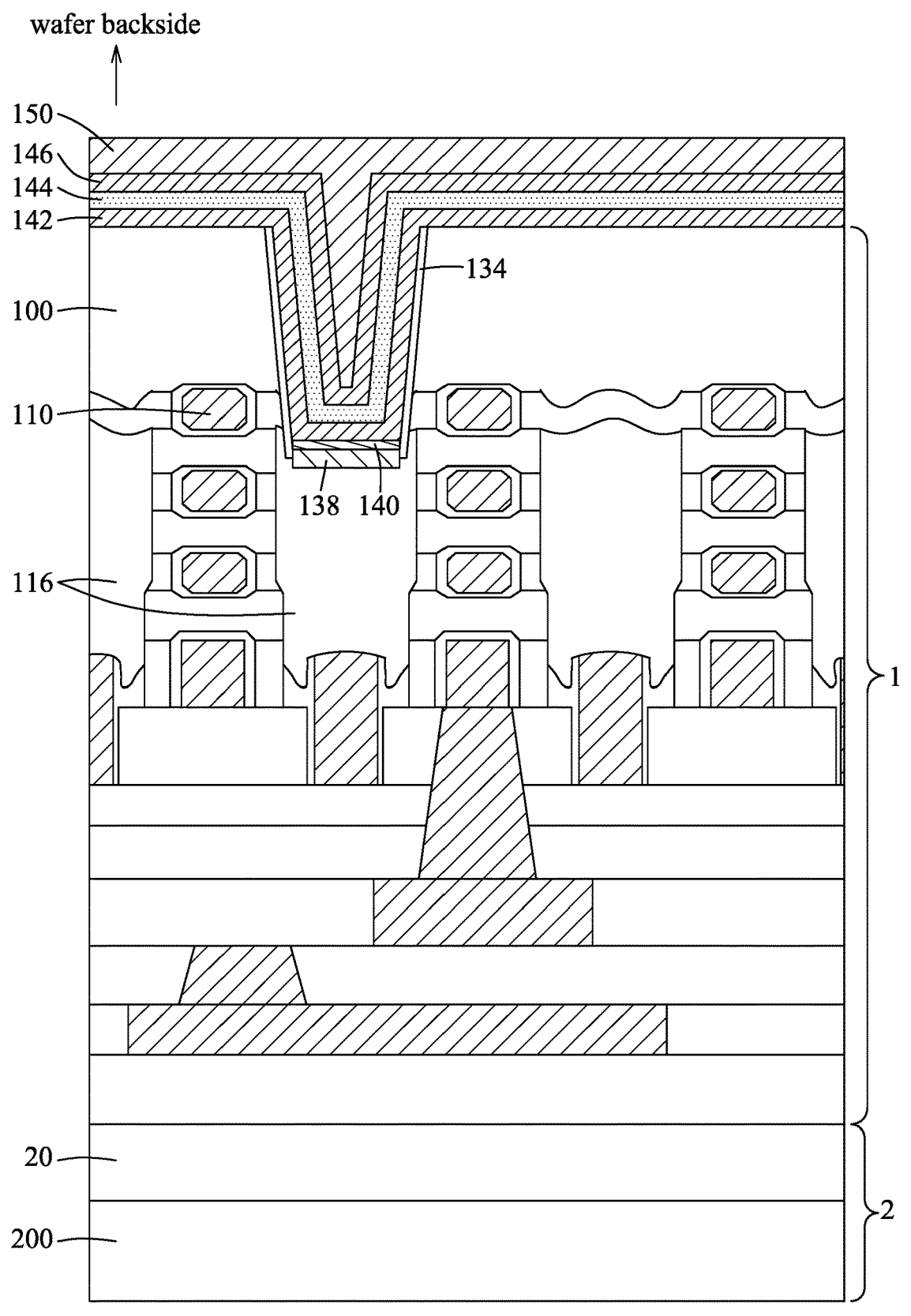

Referring to FIG. 28, a metal filling layer 150 is deposited over the second electrode layer 146 to fill the substrate indentation 132, followed by a CMP process. In accordance with some embodiments, the metal filling layer 150 may be deposited using, for example, CVD, PVD, ALD, other suitable techniques, or any combination thereof. In accordance with some embodiments, the CMP process may be performed in such a way that a portion of the resultant metal filling layer 150 that is formed above a top surface of the second electrode layer 146 has a thickness in a range from about 10 nm to 100 nm, so as to prevent the second electrode layer 146 from being damaged in the CMP process.

Figure 29:
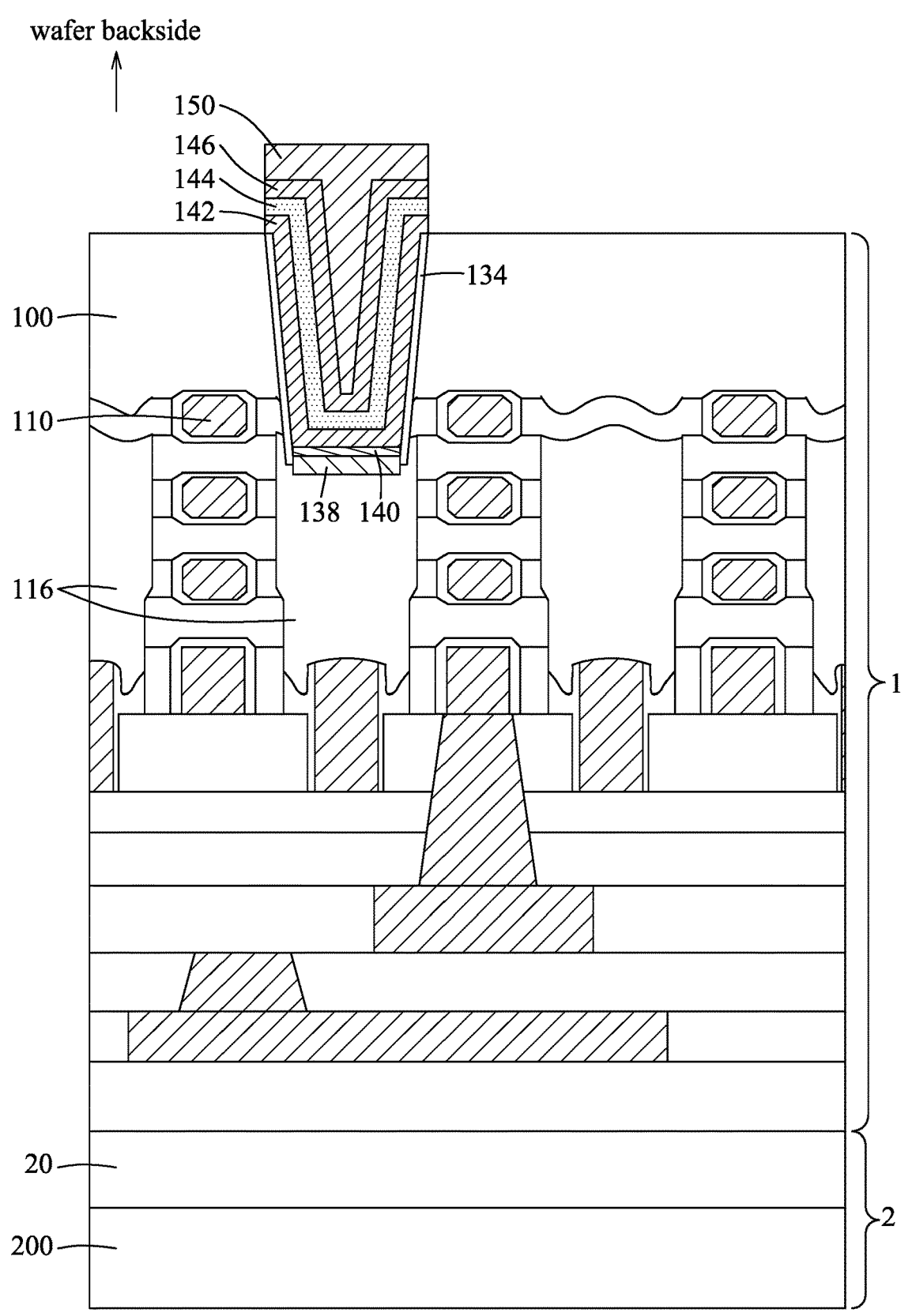

Referring to FIG. 29, a photolithography process may be performed to pattern the metal filling layer 150, the second electrode layer 146, the data-storage dielectric layer 144 and the first electrode layer 142 (see FIG. 28), so as to respectively form a patterned metal filling layer (also denoted by the reference numeral 150), a patterned second electrode layer (also denoted by the reference numeral 146), a patterned data-storage dielectric layer (also denoted by the reference numeral 144) and a patterned first electrode layer (also denoted by the reference numeral 142) that are stacked together. The etching of the metal filling layer 150, the second electrode layer 146, the data-storage dielectric layer 144 and the first electrode layer 142 may be performed using, for example, wet etching, dry etching, other suitable materials, or any combination thereof. Each of the patterned metal filling layer 150, the patterned second electrode layer 146, the patterned data-storage dielectric layer 144 and the patterned first electrode layer 142 has a first portion disposed at a bottom of the substrate indentation 132, a second portion disposed outside of the substrate indentation 132, and a third portion interconnecting the first portion and the second portion thereof. The patterned first electrode layer 142, the patterned data-storage dielectric layer 144 and the patterned second electrode layer 146 serve as the first electrode, the data-storage dielectric feature and the second electrode of the memory device, respectively.

Figure 30:
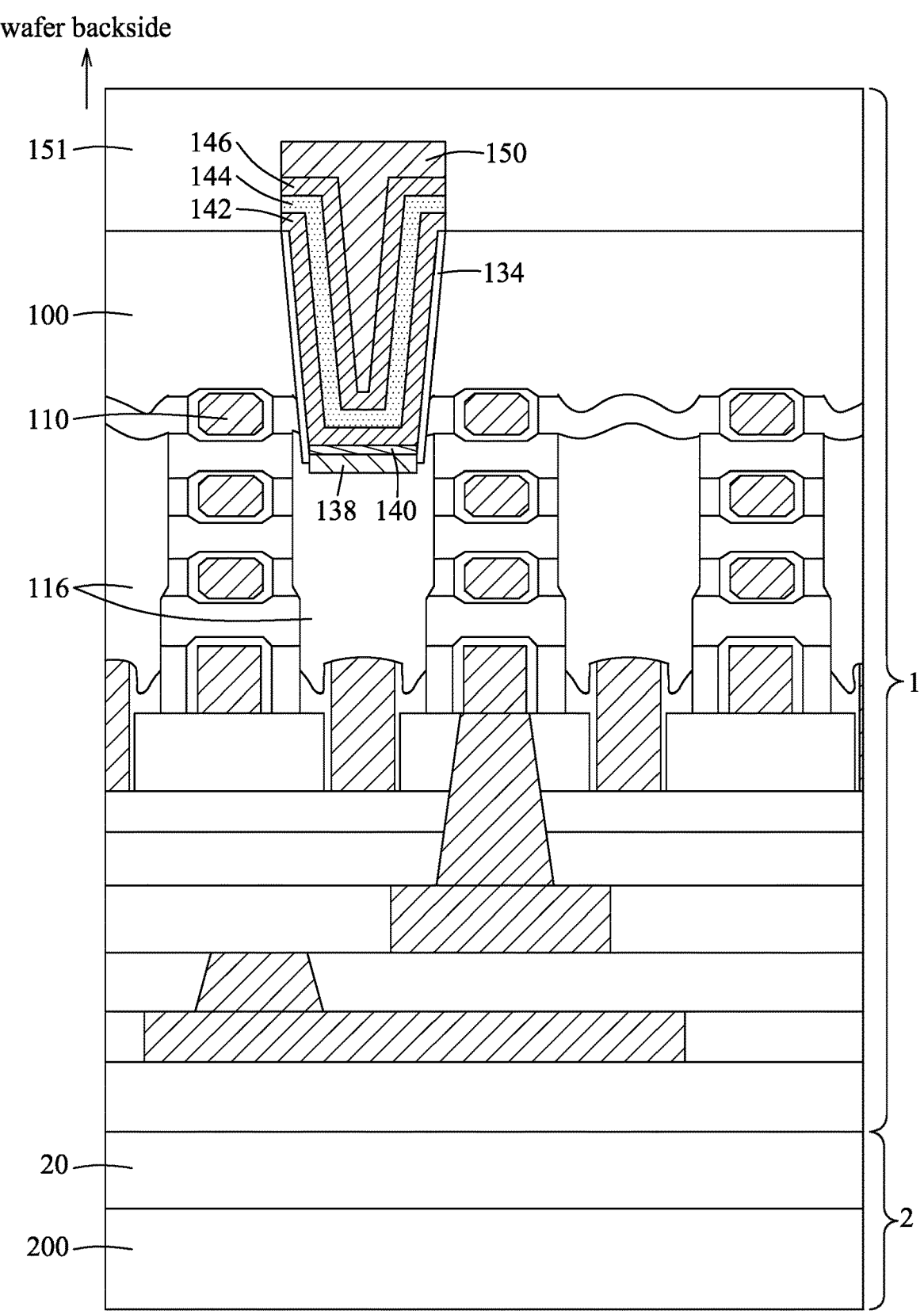

Referring to FIG. 30, an interlayer dielectric layer 151 is deposited over the backside portion of the wafer substrate 100 and the memory device using, for example, CVD, PVD other suitable techniques, or any combination thereof. The interlayer dielectric layer 151 may include, for example, SiON, SiOCN, SiO₂, other suitable low-k materials, or any combination thereof.

Figure 31:
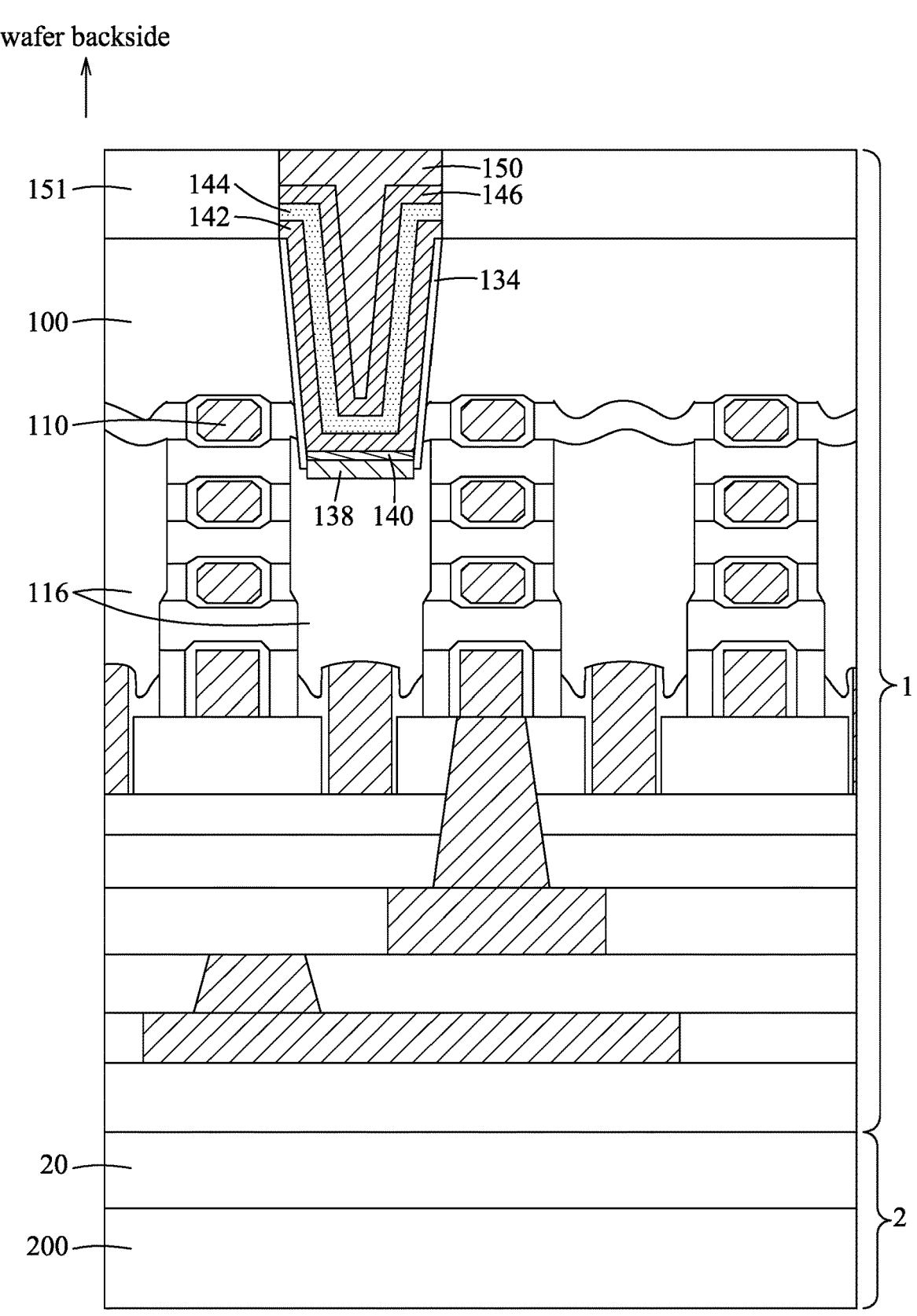

Referring to FIG. 31, a CMP process is performed to planarize a top surface of the interlayer dielectric layer 151. In the illustrative embodiments, the metal filling layer 150 is revealed after the CMP process, but this disclosure is not limited in this respect.

Figure 32:
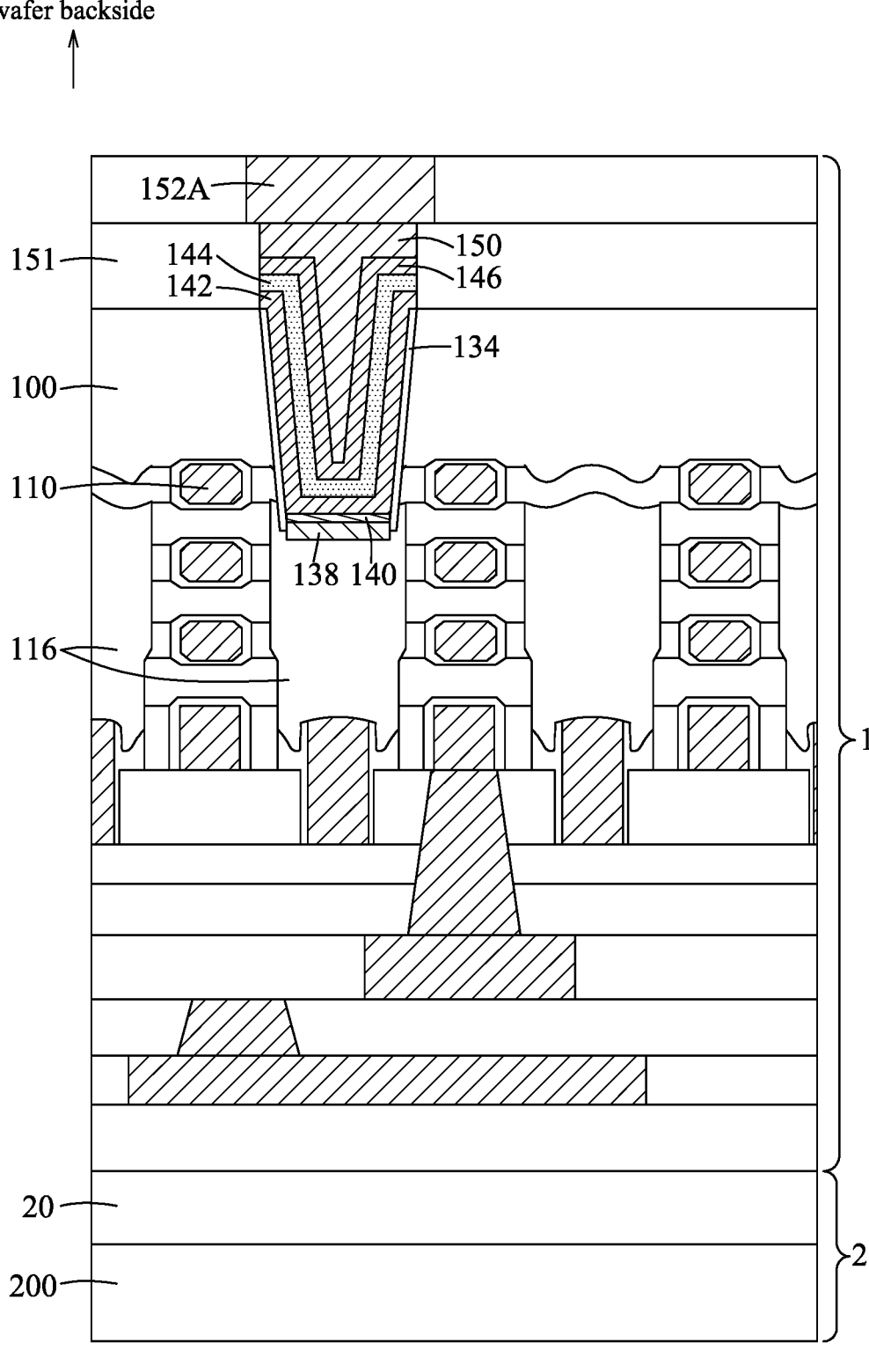
Figure 33:
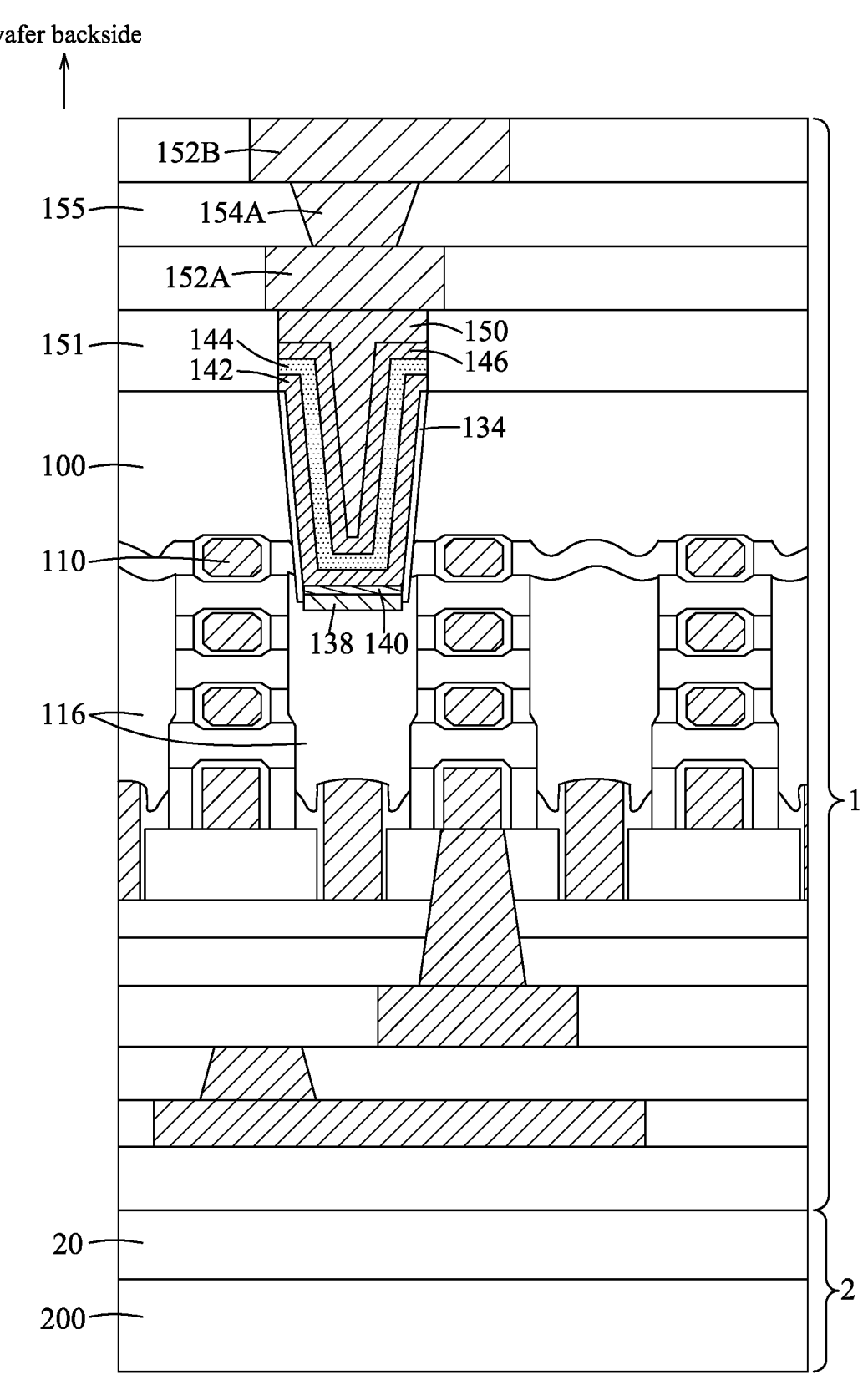
Figure 34:
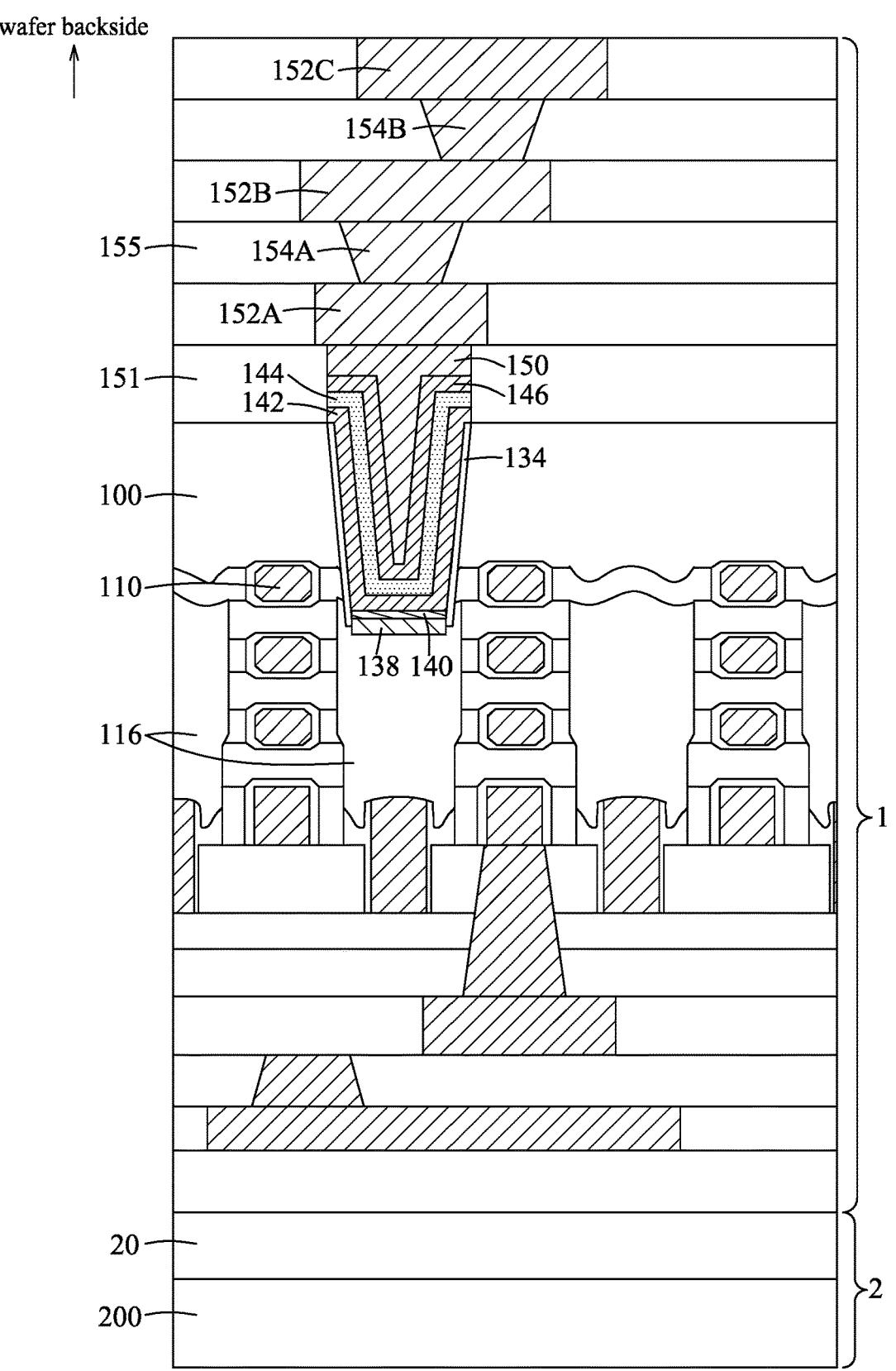

Referring to FIGS. 32 through 34, a plurality of metal wire layers are exemplarily formed above the memory device and the semiconductor devices when the backside direction is considered the upward direction. Details for forming the metal wire layers may be similar to those described for FIGS. 18 through 20, and are thus omitted herein for the sake of brevity.

As a result, the memory device as illustrated in FIG. 34 includes the first electrode 142 that is electrically connected to the semiconductor device, the data-storage dielectric feature 144 that is disposed above the first electrode 142 when the backside direction is considered the upward direction, and the second electrode 146 that is disposed above the data-storage dielectric feature 144 when the backside direction is considered the upward direction. The first electrode 142, the data-storage dielectric feature 144 and the second electrode 146 are aligned with each other in the backside direction. For each of the first electrode 142, the data-storage dielectric feature 144 and the second electrode 146, the first portion and the second portion thereof respectively lie on different planes that are perpendicular to the backside direction, and the third portion thereof interconnects the first portion and the second portion thereof. In the illustrative embodiment, the dielectric liner layer 134 is disposed between the memory device and the wafer substrate 100, and, among the first electrode 142, the data-storage dielectric feature 144 and the second electrode 146, only the first electrode 142 is in contact with the dielectric liner layer 134. A metal feature (i.e., the patterned metal filling layer 150) is in contact with and disposed above the second electrode 146 when the backside direction is considered the upward direction. The second electrode 146 may be a metal nitride layer, or may have a metal portion that is in contact with the data-storage dielectric feature 144 and a metal nitride portion that is disposed between the metal portion thereof and the metal feature 150. In comparison with the memory device depicted in FIG. 20, the data-storage dielectric feature 144 of the memory device shown in FIG. 30 has a larger contact surface with the electrodes 142, 146, so the data-storage dielectric feature 144 can hold data more effectively when the memory device is a DRAM device, an FeRAM device, or other types of memory devices.

Figure 35:
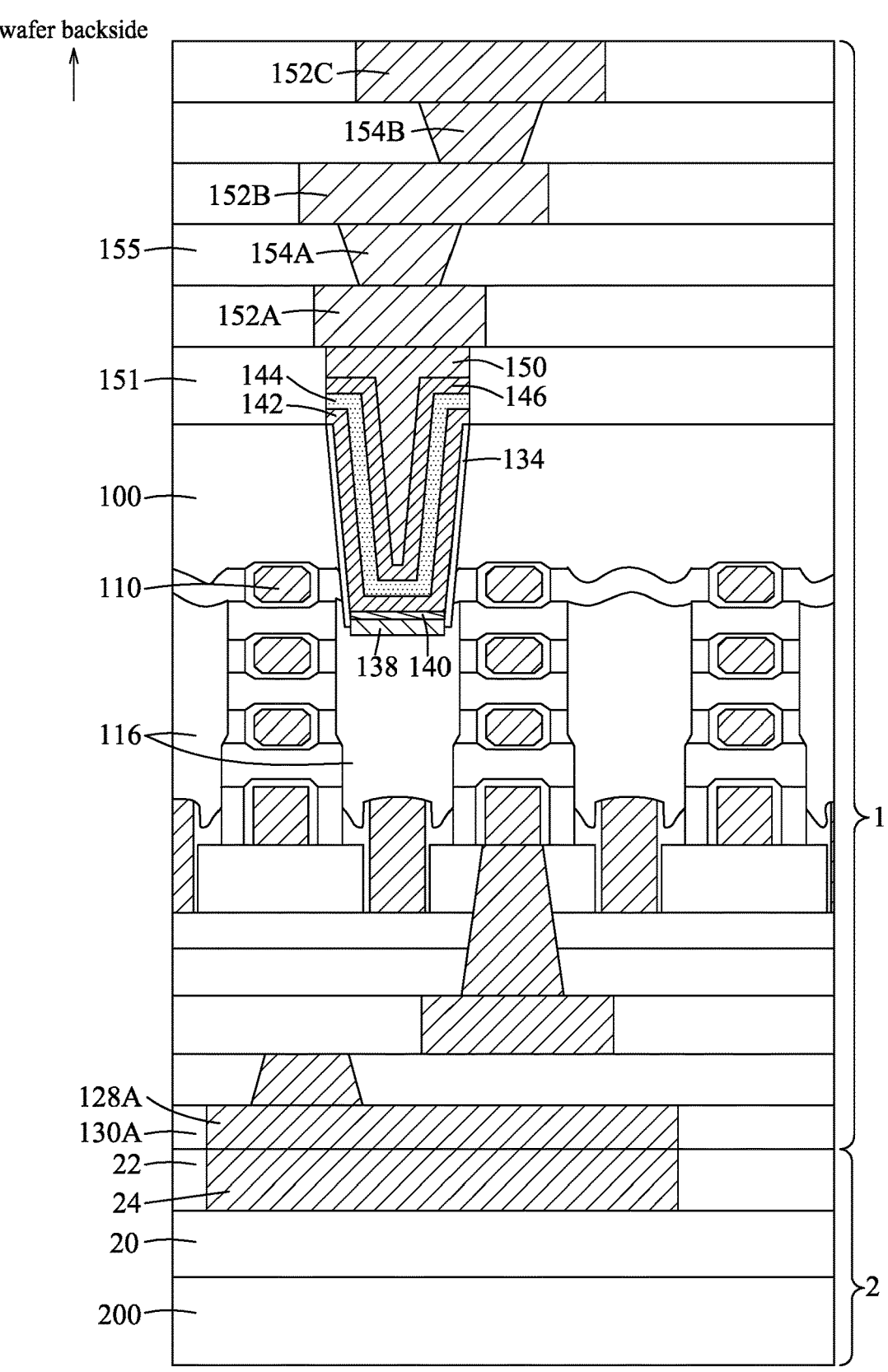
FIG. 35 is a schematic view illustrating a variation in accordance with some embodiments.

FIG. 35 illustrates a variation of a circuit structure of the embodiment as illustrate in FIG. 34. In FIG. 35, the device wafer 1 and the carrier wafer 2 are connected together by hybrid bonding. The details of the hybrid bonding are similar to those described for FIG. 21, and thus are not repeated herein for the sake of brevity.

In summary, the backside portion of the wafer substrate 100 is etched to form a substrate indentation 132, and the memory device is formed, at least in part, in the substrate indentation 132. The memory device includes the first electrode 142, the second electrode 146, and the data-storage dielectric feature 144 that is sandwiched between the first electrode 142 and the second electrode 146. Each of the first electrode 142, the data-storage dielectric feature 144 and the second electrode 146 is, at least in part, formed in the substrate indentation 132. By virtue of forming the memory device on the backside portion of the wafer substrate 100, the frontside portion of the wafer substrate 100 can have sufficient space for wire routing even if the device dimensions are reduced and the device density increases.

In accordance with some embodiments, a method for forming a memory device in a backside portion of a wafer substrate is provided. In one step, a circuit device is formed on a frontside portion of the wafer substrate that is opposite to the backside portion of the wafer substrate. In one step, the backside portion of the wafer substrate is etched to form a substrate indentation that exposes a portion of the circuit device. In one step, a memory device that is formed, at least in part, disposed in the substrate indentation, and that is electrically connected to the portion of the circuit device.

In accordance with some embodiments, the substrate indentation is above the circuit device when a backside direction is considered an upward direction, and the memory device includes a first electrode, a data-storage dielectric feature and a second electrode. The first electrode is electrically connected to the portion of the circuit device and is, at least in part, disposed in the substrate indentation. The data-storage dielectric feature is disposed above the first electrode when the backside direction is considered the upward direction, and is, at least in part, disposed in the substrate indentation. The second electrode is disposed above the data-storage dielectric feature when the backside direction is considered the upward direction, and is, at least in part, disposed in the substrate indentation.

In accordance with some embodiments, the step of forming the memory device includes the following actions. In one action, a first electrode layer is deposited over the backside portion of the wafer substrate and in the substrate indentation. In one action, a portion of the first electrode layer that is outside of the substrate indentation and a portion of the first electrode layer that is disposed on a sidewall of the substrate indentation are removed, so as to form the first electrode that is completely in the substrate indentation. In one action, after the first electrode is formed, a data-storage dielectric layer is deposited over the backside portion of the wafer substrate and in the substrate indentation. In one action, a portion of the data-storage dielectric layer that is outside of the substrate indentation and a portion of the data-storage dielectric layer that is disposed on the sidewall of the substrate indentation are removed, so as to form the data-storage dielectric feature that is completely in the substrate indentation. In one action, after the data-storage dielectric feature is formed, a second electrode layer is deposited over the backside portion of the wafer substrate and in the substrate indentation, so as to form the second electrode.

In accordance with some embodiments, the second electrode layer is a metal nitride layer, and the method further includes a step of depositing a metal filling layer over the second electrode layer that serves as a glue layer to fill the substrate indentation.

In accordance with some embodiments, the second electrode layer is a metal layer. In one step, a nitridation process is performed to transform an upper portion of the second electrode layer into a metal nitride portion. In one step, a metal filling layer is deposited over the metal nitride portion of the second electrode layer to fill the substrate indentation.

In accordance with some embodiments, the step of forming the memory device includes the following actions. In one action, a first electrode layer is conformally deposited over the backside portion of the wafer substrate and in the substrate indentation. In one action, a data-storage dielectric layer is conformally deposited over the first electrode layer and in the substrate indentation. In one action, a second electrode layer is conformally deposited over the data-storage dielectric layer and in the substrate indentation.

In accordance with some embodiments, the method further includes the following steps. In one step, a metal filling layer is deposited over the second electrode layer to fill the substrate indentation. In one step, the metal filling layer, the second electrode layer, the data-storage dielectric layer and the first electrode layer are patterned to form a patterned metal filling layer, a patterned second electrode layer, a patterned data-storage dielectric layer and a patterned first electrode layer, respectively. Each of the patterned metal filling layer, the patterned second electrode layer, the patterned data-storage dielectric layer and the patterned first electrode layer has a first portion disposed at a bottom of the substrate indentation, a second portion disposed outside of the substrate indentation, and a third portion interconnecting the first portion and the second portion thereof. The patterned first electrode layer, the patterned data-storage dielectric layer and the patterned second electrode layer serve as the first electrode, the data-storage dielectric feature and the second electrode of the memory device, respectively.

In accordance with some embodiments, the second electrode layer is a metal nitride layer that serves as a glue layer for growth of the metal filling layer thereon.

In accordance with some embodiments, the second electrode layer is a metal layer, and the method further includes a step of, before the deposition of the metal filling layer, performing a nitridation process to transform an upper portion of the second electrode layer into a metal nitride portion that serves as a glue layer for growth of the metal filling layer thereon.

In accordance with some embodiments, a memory cell is provided to include a semiconductor device, a metal wire layer, and a memory device. The semiconductor device is disposed over a substrate. The metal wire layer is disposed above the semiconductor device when a first direction is considered an upward direction. The memory device is electrically connected to the semiconductor device, and is disposed in the substrate and above the semiconductor device when a second direction that is opposite to the first direction is considered the upward direction.

In accordance with some embodiments, the memory device includes a first electrode, a data-storage dielectric feature and a second electrode. The first electrode is electrically connected to the semiconductor device. The data-storage dielectric feature is disposed above the first electrode when the second direction is considered the upward direction. The second electrode is disposed above the data-storage dielectric feature when the second direction is considered the upward direction.

In accordance with some embodiments, the memory cell further includes a dielectric liner layer that is disposed between the memory device and the substrate. Each of the first electrode, the data-storage dielectric feature and the second electrode is in contact with the dielectric liner layer.

In accordance with some embodiments, the memory cell further includes a metal feature that is in contact with and disposed above the second electrode when the second direction is considered the upward direction. The second electrode is a metal nitride layer.

In accordance with some embodiments, the memory cell further includes a metal feature that is disposed above the second electrode when the second direction is considered the upward direction. The second electrode has a metal portion that is in contact with the data-storage dielectric feature, and a metal nitride portion that is disposed between the metal portion and the metal feature. The metal portion and the metal nitride portion of the second electrode include a same metal element.

In accordance with some embodiments, each of the first electrode, the data-storage dielectric feature and the second electrode has a first portion, a second portion, and a third portion that interconnects the first portion and the second portion thereof. For each of the first electrode, the data-storage dielectric feature and the second electrode, the first portion and the second portion thereof respectively lie on different planes that are perpendicular to the second direction.

In accordance with some embodiments, the memory cell further includes a dielectric liner layer that is disposed between the memory device and the substrate. The first electrode, the data-storage dielectric feature and the second electrode are aligned with each other in the second direction, and, among the first electrode, the data-storage dielectric feature and the second electrode, only the first electrode is in contact with the dielectric liner layer.

In accordance with some embodiments, the memory cell further includes a metal feature that is in contact with and disposed above the second electrode when the second direction is considered the upward direction. The second electrode is a metal nitride layer.

In accordance with some embodiments, the memory cell further includes a metal feature that is disposed above the second electrode when the second direction is considered the upward direction. The second electrode layer has a metal portion that is in contact with the data-storage dielectric feature, and a metal nitride portion that is disposed between the metal portion and the metal feature. The metal portion and the metal nitride portion of the second electrode include a same metal element.

In accordance with some embodiments, a method is provided for forming a memory device on a wafer substrate. In one step, a circuit device is formed on the wafer substrate. In one step, a metal wire layer is formed above the circuit device when a first direction is considered an upward direction. In one step, the wafer substrate is etched to form a substrate indentation that is above the circuit device when a second direction opposite to the first direction is considered the upward direction, and that exposes a portion of the circuit device. In one step, a memory device is formed to be, at least in part, disposed in the substrate indentation, and to be electrically connected to the portion of the circuit device.

In accordance with some embodiments, the memory device includes a first electrode, a data-storage dielectric feature and a second electrode. The first electrode is electrically connected to the portion of the circuit device and is, at least in part, disposed in the substrate indentation. The data-storage dielectric feature is disposed above the first electrode when the second direction is considered the upward direction, and is, at least in part, disposed in the substrate indentation. The second electrode is disposed above the data-storage dielectric feature when the second direction is considered the upward direction, and is, at least in part, disposed in the substrate indentation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device in a backside portion of a wafer substrate, comprising steps of:

forming a circuit device on a frontside portion of the wafer substrate that is opposite to the backside portion of the wafer substrate;

etching the backside portion of the wafer substrate to form a substrate indentation that exposes a portion of the circuit device; and forming a memory device that is, at least in part, disposed in the substrate indentation, and that is electrically connected to the portion of the circuit device, wherein the step of forming the memory device includes:

depositing a first electrode layer over the backside portion of the wafer substrate and in the substrate indentation;

removing a portion of the first electrode layer that is outside of the substrate indentation and a portion of the first electrode layer that is disposed on a sidewall of the substrate indentation, so as to form a first electrode of the memory device in the substrate indentation;

after the first electrode is formed, depositing a data-storage dielectric layer over the backside portion of the wafer substrate and in the substrate indentation;

removing a portion of the data-storage dielectric layer that is outside of the substrate indentation and a portion of the data-storage dielectric layer that is disposed on the sidewall of the substrate indentation, so as to form a data-storage dielectric feature of the memory device in the substrate indentation; and after the data-storage dielectric feature is formed, depositing a second electrode layer over the backside portion of the wafer substrate and in the substrate indentation, so as to form a second electrode of the memory device.

2. The method according to claim 1, wherein the second electrode layer is a metal nitride layer, and the method further comprises a step of depositing a metal filling layer over the second electrode layer that serves as a glue layer to fill the substrate indentation.

3. The method according to claim 1, wherein the second electrode layer is a metal layer, and the method further comprises steps of:

performing a nitridation process to transform an upper portion of the second electrode layer into a metal nitride portion; and depositing a metal filling layer over the metal nitride portion of the second electrode layer to fill the substrate indentation.

4. The method according to claim 1, wherein the first electrode layer is conformally deposited over the backside portion of the wafer substrate and in the substrate indentation, the data-storage dielectric layer is conformally deposited over the first electrode layer and in the substrate indentation, and the second electrode layer is conformally deposited over the data-storage dielectric layer and in the substrate indentation.

5. The method according to claim 4, further comprising steps of:

depositing a metal filling layer over the second electrode layer to fill the substrate indentation; and patterning the metal filling layer, the second electrode layer, the data-storage dielectric layer and the first electrode layer to form a patterned metal filling layer, a patterned second electrode layer, a patterned data-storage dielectric layer and a patterned first electrode layer, respectively;

wherein each of the patterned metal filling layer, the patterned second electrode layer, the patterned data-storage dielectric layer and the patterned first electrode layer has a first portion disposed at a bottom of the substrate indentation, a second portion disposed outside of the substrate indentation, and a third portion inter-connecting the first portion and the second portion thereof, and wherein the patterned first electrode layer, the patterned data-storage dielectric layer and the patterned second electrode layer serve as the first electrode, the data-storage dielectric feature and the second electrode of the memory device, respectively.

6. The method according to claim 5, wherein the second electrode layer is a metal nitride layer that serves as a glue layer for growth of the metal filling layer thereon.

7. The method according to claim 5, wherein the second electrode layer is a metal layer, and the method further comprises a step of:

before the deposition of the metal filling layer, performing a nitridation process to transform an upper portion of the second electrode layer into a metal nitride portion that serves as a glue layer for growth of the metal filling layer thereon.

8. The method according to claim 1, wherein the step of forming the memory device includes, before the depositing of the first electrode layer:

forming a silicide layer on the circuit device and in the substrate indentation; and forming a metal nitride layer on the silicide layer in the substrate indentation;

wherein the silicide layer and the metal nitride layer include a same metal element.

9. The method according to claim 8, wherein the forming of the silicide layer includes:

conformally depositing a metal film on the backside portion of the wafer substrate and in the substrate indentation, and causing the metal film to react with the a silicon-containing feature of the circuit device to form the silicide layer at an interface between the silicon-containing feature and the metal film; and wherein the forming of the metal nitride layer includes performing a plasma treatment that uses a gas including nitrogen to transform the metal film into the metal nitride layer.

10. The method according to claim 1, further comprising, before the step of forming the memory device, a step of forming a dielectric liner layer in the substrate indentation, so that the dielectric liner layer is disposed between the memory device and the wafer substrate.

11. A method for forming a memory device on a wafer substrate, comprising steps of:
    forming a circuit device on the wafer substrate;
    forming a metal wire layer at a first side of the circuit device;
    etching the wafer substrate to form a substrate indentation at a second side of the circuit device that is opposite to the first side of the circuit device, wherein the substrate indentation exposes a portion of the circuit device; and
    forming a memory device that is, at least in part, disposed in the substrate indentation, and that is electrically connected to the portion of the circuit device,
    wherein the method further comprises, before the step of forming the memory device, a step of forming a dielectric liner layer in the substrate indentation, so that the dielectric liner layer is disposed between the memory device and the wafer substrate.

12. The method according to claim 11, wherein the memory device includes:
    a first electrode that is electrically connected to the portion of the circuit device and that is, at least in part, disposed in the substrate indentation;
    a data-storage dielectric feature that is disposed on the first electrode, and that is, at least in part, disposed in the substrate indentation; and
    a second electrode that is disposed on the data-storage dielectric feature, and that is, at least in part, disposed in the substrate indentation.

13. The method according to claim 12, wherein, after the step of forming the memory device, each of the first electrode, the data-storage dielectric feature and the second electrode is in contact with the dielectric liner layer.

14. The method according to claim 12, wherein the memory device further includes a metal feature that is in contact with and disposed on the second electrode at a side opposite the data-storage dielectric feature, and wherein the second electrode is a metal nitride layer.

15. The method according to claim 12, wherein the memory device further includes a metal feature that is disposed on the second electrode at a side opposite the data-storage dielectric feature;
    wherein the second electrode has a metal portion that is connected to the data-storage dielectric feature, and a metal nitride portion that is disposed between the metal portion and the metal feature; and
    wherein the metal portion and the metal nitride portion of the second electrode include a same metal element.

16. The method according to claim 12, wherein each of the first electrode, the data-storage dielectric feature and the second electrode has a first portion, a second portion, and a third portion that interconnects the first portion and the second portion thereof; and
    wherein, for each of the first electrode, the data-storage dielectric feature and the second electrode, the first portion and the second portion thereof respectively lie on different planes that are perpendicular to a direction toward which the second side of the of the circuit device is oriented.

17. The method according to claim 16, wherein the first electrode, the data-storage dielectric feature and the second electrode are aligned with each other along the direction.

18. The method according to claim 17, wherein, among the first electrode, the data-storage dielectric feature and the second electrode, only the first electrode is in contact with the dielectric liner layer.

19. A method for forming a memory device on a device wafer, comprising steps of:
    bonding a carrier wafer to a frontside portion of the device wafer, the device wafer including a semiconductor device disposed in the frontside portion of the device wafer;
    etching a backside portion of the device wafer to form a substrate indentation in a substrate of the device wafer, wherein a silicon-containing feature of the semiconductor device is exposed from the substrate indentation;
    forming a dielectric liner layer on a sidewall of the substrate indentation, with the silicon-containing feature being exposed from the substrate indentation; and
    forming a memory device in the substrate indentation, where the dielectric liner layer is disposed between the memory device and the substrate of the device wafer.

20. The method according to claim 19, wherein the step of forming the memory device includes:
    forming a silicide layer on the silicon-containing feature and in the substrate indentation;
    forming a first electrode on the silicide layer and in the substrate indentation;
    forming a data-storage dielectric feature on the first electrode and in the substrate indentation; and
    forming a second electrode on the data-storage dielectric feature and in the substrate indentation.

* * * * *